(12) United States Patent
Li et al.

(10) Patent No.: US 12,339,738 B2
(45) Date of Patent: Jun. 24, 2025

(54) METHOD AND CHIP FOR CYCLIC CODE ENCODING, CIRCUIT COMPONENT, AND ELECTRONIC DEVICE

(71) Applicant: Huawei Technologies Co., Ltd., Shenzhen (CN)

(72) Inventors: Liang Li, Beijing (CN); Chun Yuan, Shenzhen (CN); Yuchun Lu, Beijing (CN); Lin Ma, Shenzhen (CN); Yongzhi Liu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 64 days.

(21) Appl. No.: 18/489,276

(22) Filed: Oct. 18, 2023

(65) Prior Publication Data

US 2024/0045758 A1 Feb. 8, 2024

Related U.S. Application Data

(63) Continuation of application No. PCT/CN2022/084531, filed on Mar. 31, 2022.

(30) Foreign Application Priority Data

Apr. 19, 2021 (CN) .......................... 202110420963.7

(51) Int. Cl.
*G06F 11/08* (2006.01)
*H03M 13/00* (2006.01)
(Continued)

(52) U.S. Cl.
CPC .......... *G06F 11/085* (2013.01); *H03M 13/11* (2013.01); *H03M 13/15* (2013.01);
(Continued)

(58) Field of Classification Search
CPC ..... G06F 11/085; H03M 13/11; H03M 13/15; H03M 13/611; H03M 13/6561;
(Continued)

(56) References Cited

U.S. PATENT DOCUMENTS 11,502,805 B2 * 11/2022 Davydov .............. H04L 5/0055
12,126,564 B2 * 10/2024 Davydov .............. H04L 5/0057
(Continued)

FOREIGN PATENT DOCUMENTS

CN 101771500 A 7/2010
CN 104734815 A 6/2015
(Continued)

OTHER PUBLICATIONS

Bo Zheng et al, "High-Throughput Low-Latency Encoder and Decoder for a Class of Generalized Reed-Solomon Codes for Short-Reach Optical Communications," IEEE Transactions on Circuits and Systems-II: Express Briefs, vol. 67, No. 4, Apr. 2020, 5 pages.
(Continued)

*Primary Examiner* — John J Tabone, Jr.
(74) *Attorney, Agent, or Firm* — Conley Rose, P.C.

(57) ABSTRACT

A method for cyclic code encoding includes: generating, based on a first symbol sequence related to a first part of symbols in the K payload symbols, a first parity sequence corresponding to the first symbol sequence; generating, based on a second symbol sequence related to a second part of symbols in the K payload symbols, a second parity sequence corresponding to the second symbol sequence, where the first part of symbols are different from the second part of symbols; and generating the (N−K) parity symbols based on the first parity sequence and the second parity sequence.

27 Claims, 9 Drawing Sheets

(51) Int. Cl.
  *H03M 13/09* (2006.01)
  *H03M 13/11* (2006.01)
  *H03M 13/15* (2006.01)
  *H03M 13/17* (2006.01)
  *H04L 1/00* (2006.01)

(52) U.S. Cl.
  CPC ..... *H03M 13/611* (2013.01); *H03M 13/6561* (2013.01); *H04L 1/0041* (2013.01); *H04L 1/0057* (2013.01); *H03M 13/09* (2013.01); *H03M 13/152* (2013.01); *H03M 13/17* (2013.01)

(58) Field of Classification Search
  CPC .... H03M 13/09; H03M 13/152; H03M 13/17; H04L 1/0041; H04L 1/0057
  USPC .......................... 714/800, 821, 752, 776, 782
  See application file for complete search history.

(56) References Cited

U.S. PATENT DOCUMENTS

| | | | | |
|---|---|---|---|---|
| 2008/0148127 | A1* | 6/2008 | Miyata | H04L 1/0083 714/755 |
| 2013/0151921 | A1* | 6/2013 | Uchikawa | H03M 13/118 714/752 |
| 2014/0317478 | A1 | 10/2014 | Anholt | |
| 2018/0262303 | A1* | 9/2018 | Jia | H03M 13/2906 |
| 2019/0181980 | A1* | 6/2019 | Lou | H04L 1/0058 |
| 2019/0280719 | A1* | 9/2019 | Yu | H04L 1/0058 |
| 2020/0028619 | A1* | 1/2020 | Maevskii | H04L 1/0068 |
| 2020/0120605 | A1* | 4/2020 | Tomeba | H04W 52/02 |
| 2020/0186170 | A1* | 6/2020 | Hui | H03M 13/091 |
| 2020/0212943 | A1* | 7/2020 | Banin | H04B 1/04 |
| 2023/0090431 | A1* | 3/2023 | Banin | H04B 1/04 375/295 |
| 2024/0045758 | A1* | 2/2024 | Li | H03M 13/611 |

FOREIGN PATENT DOCUMENTS

| | | | | |
|---|---|---|---|---|
| CN | 108123776 | A | 6/2018 | |
| CN | 109951250 | A | 6/2019 | |
| CN | 112491500 | A | 3/2021 | |
| JP | 2004072130 | A | 3/2004 | |
| WO | WO-2019032802 | A1 * | 2/2019 | ........... H04L 1/1671 |

OTHER PUBLICATIONS

Mário Véstias, et al, "Design of an IEEE 802.15.3c Baseband Processor in FPGA," IEEE Second International Conference on Consumer Electronics—Berlin, Sep. 3-5, 2012, 5 pages.

* cited by examiner

METHOD AND CHIP FOR CYCLIC CODE ENCODING, CIRCUIT COMPONENT, AND ELECTRONIC DEVICE

CROSS-REFERENCE TO RELATED APPLICATIONS

This is a continuation of Int'l Patent App. No. PCT/CN2022/084531, filed on Mar. 31, 2022, which claims priority to Chinese Patent App. No. 202110420963.7, filed on Apr. 19, 2021, both of which are incorporated by reference.

FIELD

Embodiments generally relate to the data processing field, and more specifically, to a method and a chip for cyclic code encoding, a circuit component, and an electronic device.

BACKGROUND

With the development of information technologies such as cloud computing, big data, artificial intelligence, and the Internet of Things, the global data scale is growing explosively. Such ultra-large-scale data processing requirements continuously promote the development of Ethernet technologies. As a widely used local area network technology, the Ethernet technology has an interface speed developing from an initial 10 megabits per second (Mbps), 100 Mbps, and 1000 Mbps to the current 400 Gigabit Ethernet (GE). In addition, 800 GE or even higher-rate standards are being developed.

In terms of functions, a hierarchical architecture of the Ethernet standard includes a media access control (MAC) sublayer, a physical coding sublayer (PCS), a physical media connection (PMA) sublayer, and a physical media dependent (PMD) sublayer. The PCS, the PMA sublayer, and the PMD sublayer form a physical layer (PHY). Cyclic code is a widely used forward error correction (FEC) technology in Ethernet applications. For example, both a cyclic redundancy check (CRC) technology used at an Ethernet MAC sublayer and a Reed-Solomon (RS) code used in the PCS are cyclic codes. In the communications field, in addition to the RS code and the CRC, a BCH code and a fire code are all cyclic codes.

Generally, to be in a minimum implementation cost, an encoding architecture of a cyclic code is bound to a throughput capability of an encoder. For example, an encoder with a throughput capability of 400 Gbps and an encoder with a throughput capability of 200 Gbps usually have different design parameters (for example, bit width, clock frequency) to be in a minimum implementation cost. In this case, one encoding architecture supports a throughput capability of only one encoder. This enables the encoding architecture of the cyclic code to be inflexible.

SUMMARY

Example embodiments of the present disclosure provide a scheme for cyclic code encoding.

According to a first aspect, a cyclic code encoding method is provided. A first cyclic code includes K payload symbols and (N−K) parity symbols, and each symbol includes m bits, where K, N, and m are integers greater than or equal to 1, and N is greater than K. The method includes: generating, based on a first symbol sequence related to a first part of symbols in the K payload symbols, a first parity sequence corresponding to the first symbol sequence; generating, based on a second symbol sequence related to a second part of symbols in the K payload symbols, a second parity sequence corresponding to the second symbol sequence, where the first part of symbols are different from the second part of symbols; and generating the (N−K) parity symbols based on the first parity sequence and the second parity sequence. In this way, a small bit width cyclic code encoder may be used to implement large bit width cyclic code encoding. This facilitates high-speed clock convergence and reduces technical difficulty and complexity of implementing the large bit width encoder.

In some embodiments, the method further includes: determining whether a first data rate of first to-be-encoded data including the K payload symbols exceeds a data rate threshold; if it is determined that the first data rate exceeds the data rate threshold, determining, based on the first data rate and the data rate threshold, that the K payload symbols are to be split into L symbol sequences, where L is a positive integer greater than 1; and generating the L symbol sequences based on the K payload symbols, where the L symbol sequences include the first symbol sequence and the second symbol sequence. In this manner, a quantity of symbol sequences into which a payload symbol needs to be split may be set based on an amount of data to be encoded, to properly use encoder resources.

In some embodiments, the generating L symbol sequences includes: for an $i^{th}$ symbol sequence in the L symbol sequences, where i is an integer ranging from 0 to (L−1), generating a $j^{th}$ symbol in the $i^{th}$ symbol sequence based on an $(i+L*j)^{th}$ symbol in the K payload symbols, where j is an integer ranging from 0 to (K/L−1). In this manner, the payload symbol may be split with relatively small calculation costs based on properties of cyclic code encoding.

In some embodiments, m is an integer greater than 1, each symbol in the first symbol sequence is equal to an $L^{th}$ root of a corresponding symbol in the first part of symbols, and each symbol in the second symbol sequence is equal to an $L^{th}$ root of a corresponding symbol in the second part of symbols. In this manner, the payload symbol may be split with relatively small calculation costs based on properties of cyclic code encoding.

In some embodiments, a quantity of symbols included in each of the first parity sequence and the second parity sequence is (N−K). In such an embodiment, parity sequences generated by different encoders have a same quantity of symbols. In this manner, a combination operation of the parity sequence can be simplified.

In some embodiments, the generating the (N−K) parity symbols based on the first parity sequence and the second parity sequence includes: generating a square of each symbol in the first parity sequence and a square of each symbol in the second parity sequence; and generating the (N−K) parity symbols based on a square of a symbol generated for the first parity sequence and the second parity sequence and a generator polynomial of the first cyclic code. In this manner, the parity sequences may be combined with relatively small calculation costs based on properties of cyclic code encoding to generate a final parity symbol.

In some embodiments, a second cyclic code includes K' payload symbols and (N'−K') parity symbols, and each symbol includes m bits, where K' and N' are integers greater than or equal to 1, N' is greater than K', and (N'−K') is equal to (N−K). The method further includes: determining whether a second data rate of second to-be-encoded data including the K' payload symbols exceeds a data rate threshold; and if it is determined that the second data rate does not exceed the data rate threshold, generating the (N'−K') parity symbols based on the K' payload symbols. In this manner, a low throughput mode may also be supported, thereby having higher flexibility and being applicable to a plurality of scenarios.

In some embodiments, the second data rate is less than the data rate threshold. The generating the (N'−K') parity symbols based on the K' payload symbols includes: storing the second to-be-encoded data passed over time; and generating the (N'−K') parity symbols based on the K' payload symbols in response to a case in which a data amount of the stored second to-be-encoded data matches the data rate threshold. In this way, spatial-temporal conversion can be implemented to process a service flow with a lower data rate, which further increases flexibility.

In some embodiments, the method further includes: generating the first symbol sequence based on a square root of an even-numbered symbol in the K payload symbols; and generating the second symbol sequence based on a square root of an odd-numbered symbol in the K payload symbols. In this manner, in a case of one-level splitting, the payload symbol may be split at a relatively small calculation cost.

In some embodiments, the generating the (N−K) parity symbols includes: generating a rearranged parity sequence based on the first parity sequence and the second parity sequence, where in the rearranged parity sequence, a square of a parity symbol in the first parity sequence and a square of a parity symbol in the second parity sequence are arranged in an interleaved manner; and generating the (N−K) parity symbols based on the rearranged parity sequence and a generator polynomial of the first cyclic code. In this manner, in a case of one-level combination, the parity sequences may be combined with relatively small calculation costs to obtain a final parity symbol.

In some embodiments, the method further includes: generating respectively a first primary symbol sequence and a second primary symbol sequence based on an even-numbered symbol and an odd-numbered symbol in the K payload symbols; generating respectively a first secondary symbol sequence and a second secondary symbol sequence based on an even-numbered symbol and an odd-numbered symbol in the first primary symbol sequence; and generating respectively a third secondary symbol sequence and a fourth secondary symbol sequence based on an even-numbered symbol and an odd-numbered symbol in the second primary symbol sequence, where the first symbol sequence and the second symbol sequence are two of the first secondary symbol sequence, the second secondary symbol sequence, the third secondary symbol sequence, and the fourth secondary symbol sequence. In this manner, in a case of two-level splitting, the payload symbol may be split at a relatively small calculation cost.

In some embodiments, the generating the (N−K) parity symbols includes: generating a first primary combined sequence based on a parity sequence corresponding to the first secondary symbol sequence, a parity sequence corresponding to the second secondary symbol sequence, and a generator polynomial of the first cyclic code; generating a second primary combined sequence based on a parity sequence corresponding to the third secondary symbol sequence, a parity sequence corresponding to the fourth secondary symbol sequence, and the generator polynomial; and generating the (N−K) symbols based on the first primary combined sequence, the second primary combined sequence, and the generator polynomial. In this manner, in a case of two-level combination, the parity sequences may be combined with relatively small calculation costs to obtain a final parity symbol.

According to a second aspect, a chip used for cyclic code encoding is provided. A first cyclic code includes K payload symbols and (N−K) parity symbols, and each symbol includes m bits, where K, N, and m are integers greater than or equal to 1, and N is greater than K. The chip includes: a first encoder configured to generate, based on a first symbol sequence related to a first part of symbols in the K payload symbols, a first parity sequence corresponding to the first symbol sequence; a second encoder configured to generate, based on a second symbol sequence related to a second part of symbols in the K payload symbols, a second parity sequence corresponding to the second symbol sequence, where the first part of symbols are different from the second part of symbols; and a combiner configured to generate the (N−K) parity symbols based on the first parity sequence and the second parity sequence. In this way, a small bit width cyclic code encoder may be used to implement large bit width cyclic code encoding. This facilitates high-speed clock convergence and reduces technical difficulty and complexity of implementing the large bit width encoder.

In some embodiments, the chip further includes a controller configured to: determine whether a first data rate of first to-be-encoded data including the K payload symbols exceeds a data rate threshold; if it is determined that the first data rate exceeds the data rate threshold, determine, based on the first data rate and the data rate threshold, that the K payload symbols are to be split into L symbol sequences; and generate a first control instruction indicating that the K payload symbols are to be split into the L symbol sequences; and a splitter configured to generate the L symbol sequences based on the first control instruction and the K payload symbols, where the L symbol sequences include the first symbol sequence and the second symbol sequence. In this manner, a quantity of symbol sequences into which a payload symbol needs to be split may be set based on an amount of data to be encoded, to properly use encoder resources.

In some embodiments, the splitter is further configured to: for an $i^{th}$ symbol sequence in the L symbol sequences, where i is an integer ranging from 0 to (L−1), generate a $j^{th}$ symbol in the $i^{th}$ symbol sequence based on an $(i+L*j)^{th}$ symbol in the K payload symbols, where j is an integer ranging from 0 to (K/L−1). In this manner, the payload symbol may be split with relatively small calculation costs based on properties of cyclic code encoding.

In some embodiments, the splitter includes a $\log_2$ L-level sub-splitter, and each sub-splitter is configured to: generate two symbol sequences based on a received symbol sequence, where the two symbol sequences are respectively related to an even-numbered symbol and an odd-numbered symbol in the received symbol sequence, where the K payload symbols are received by a level-1 sub-splitter, and the first symbol sequence and the second symbol sequence are generated by a level-$\log_2$ L sub-splitter. In this manner, by arranging the sub-splitter in a hierarchical manner, flexibility may be increased. In addition, each sub-splitter may be implemented in a similar manner, which helps to reduce an implementation cost.

In some embodiments, the combiner includes at least two sub-combiners, and each sub-combiner is configured to: generate a parity sequence based on two received parity sequences and a generator polynomial of the first cyclic code, where the at least two sub-combiners are configured to form a $\log_2$ L-level sub-combiner, the first parity sequence and the second parity sequence are received by a level-1 sub-combiner, and the (N−K) parity symbols are generated by a level-$\log_2$ L sub-combiner. In this manner, by arranging the sub-combiner in a hierarchical manner, flexibility may be increased. In addition, each sub-combiner may be implemented in a similar manner, which helps to reduce an implementation cost. The $\log_2$ L-level sub-combiner may also be implemented by multiplexing one or more sub-combiners, which helps to further reduce the implementation cost.

In some embodiments, m is an integer greater than 1, each symbol in the first symbol sequence is equal to an $L^{th}$ root of a corresponding symbol in the first part of symbols, and each symbol in the second symbol sequence is equal to an $L^{th}$ root of a corresponding symbol in the second part of symbols. In this manner, the payload symbol may be split with relatively small calculation costs based on properties of cyclic code encoding.

In some embodiments, a quantity of symbols included in each of the first parity sequence and the second parity sequence is (N−K). In such an embodiment, parity sequences generated by different encoders have a same quantity of symbols. In this manner, a combination operation of the parity sequence can be simplified.

In some embodiments, the combiner is further configured to: generate a square of each symbol in the first parity sequence and a square of each symbol in the second parity sequence; and generate the (N−K) parity symbols based on a square of a symbol generated for the first parity sequence and the second parity sequence and a generator polynomial of the first cyclic code. In this manner, the parity sequences may be combined with relatively small calculation costs based on properties of cyclic code encoding to generate a final parity symbol.

In some embodiments, a second cyclic code includes K' payload symbols and (N'—K') parity symbols, and each symbol includes m' bits, where K', N', and m' are integers greater than or equal to 1, and N' is greater than K'. The chip further includes: a controller configured to: determine whether a second data rate of second to-be-encoded data including the K' payload symbols exceeds a data rate threshold; and if it is determined that the second data rate does not exceed the data rate threshold, generate a second control instruction indicating not to split the K' payload symbols; and a third encoder configured to generate the (N'—K') parity symbols based on the second control instruction and the K' payload symbols. In this manner, a low throughput mode may also be supported, thereby having higher flexibility and being applicable to a plurality of scenarios.

In some embodiments, the second data rate is less than the data rate threshold, and the third encoder is further configured to: store the second to-be-encoded data passed over time; and generate the (N'—K') parity symbols based on the K' payload symbols in response to a case in which a data amount of the stored second to-be-encoded data matches the data rate threshold. In this way, spatial-temporal conversion can be implemented to process a service flow with a lower data rate, which further increases flexibility.

In some embodiments, there is a splitter configured to: generate the first symbol sequence based on a square root of an even-numbered symbol in the K payload symbols; and generate the second symbol sequence based on a square root of an odd-numbered symbol in the K payload symbols. In this manner, in a case of one-level splitting, the payload symbol may be split at a relatively small calculation cost.

In some embodiments, the combiner is further configured to: generate a rearranged parity sequence based on the first parity sequence and the second parity sequence, where in the rearranged parity sequence, a square of a parity symbol in the first parity sequence and a square of a parity symbol in the second parity sequence are arranged in an interleaved manner; and generate the (N−K) parity symbols based on the rearranged parity sequence and a generator polynomial of the first cyclic code. In this manner, in a case of one-level combination, the parity sequences may be combined with relatively small calculation costs to obtain a final parity symbol.

In some embodiments, there is a first sub-splitter configured to generate respectively a first primary symbol sequence and a second primary symbol sequence based on an even-numbered symbol and an odd-numbered symbol in the K payload symbols; a second sub-splitter configured to generate respectively a first secondary symbol sequence and a second secondary symbol sequence based on an even-numbered symbol and an odd-numbered symbol in the first primary symbol sequence; and a third sub-splitter configured to generate respectively a third secondary symbol sequence and a fourth secondary symbol sequence based on an even-numbered symbol and an odd-numbered symbol in the second primary symbol sequence, where the first symbol sequence and the second symbol sequence are two of the first secondary symbol sequence, the second secondary symbol sequence, the third secondary symbol sequence, and the fourth secondary symbol sequence. In this manner, in a case of two-level splitting, the payload symbol may be split at a relatively small calculation cost.

In some embodiments, the combiner includes: a first sub-combiner configured to generate a first primary combined sequence based on a parity sequence corresponding to the first secondary symbol sequence, a parity sequence corresponding to the second secondary symbol sequence, and a generator polynomial of the first cyclic code; a second sub-combiner configured to generate a second primary combined sequence based on a parity sequence corresponding to the third secondary symbol sequence, a parity sequence corresponding to the fourth secondary symbol sequence, and the generator polynomial; and a third sub-combiner configured to generate the (N−K) symbols based on the first primary combined sequence, the second primary combined sequence, and the generator polynomial. In this manner, in a case of two-level combination, the parity sequences may be combined with relatively small calculation costs to obtain a final parity symbol.

According to a third aspect, a circuit component is provided. The circuit component includes: a circuit board; and the chip according to the second aspect, where the chip is mounted on the circuit board.

According to a fourth aspect, an electronic device is provided. The electronic device includes the circuit component according to the third aspect.

BRIEF DESCRIPTION OF THE DRAWINGS

The foregoing and other features, advantages, and aspects of embodiments of the present disclosure become more obvious with reference to the accompanying drawings and with reference to the following detailed descriptions. In the accompanying drawings, same or similar reference numerals represent same or similar elements.

DETAILED DESCRIPTION

Figure 1:
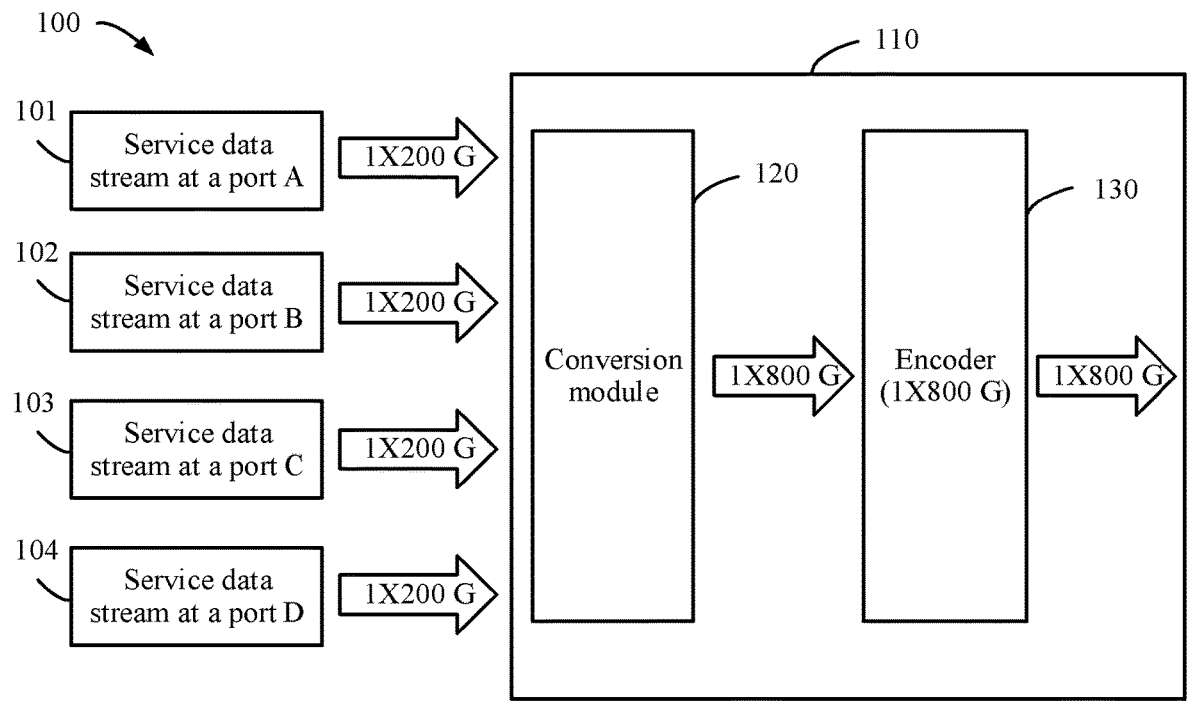
FIG. 1 is a scenario of a spatial-temporal multiplexing encoding architecture for cyclic code encoding.

The principles of the present disclosure will now be described with reference to some example embodiments. It should be understood that these embodiments are described only for purposes of illustration and help those skilled in the art understand and implement the present disclosure, without implying any limitation on the scope of the present disclosure. In addition to the manners described below, the disclosed content described in this specification may be implemented in various manners.

In the following descriptions and claims, unless otherwise defined, all technical and scientific terms used in this specification have meanings as those commonly understood by a person of ordinary skill in the art to which the present disclosure belongs.

As used in this specification, the singular forms "a", "one", and "the" are also intended to include plural forms, unless the context explicitly states otherwise. The term "include" and its variants shall be interpreted as open-ended terms, meaning "include but not limited to". The term "based on" should be interpreted as "at least partially based on". The terms "an embodiment" and "embodiments" should be interpreted as "at least one embodiment". The term "another embodiment" should be understood as "at least one other embodiment". The terms "first", "second", and the like may indicate different or same objects. Other definitions (explain and implicit) may be included below.

As used in this specification, the term "cyclic code" refers to an important subclass of linear codes. The cyclic code has the following two features: First, a structure of the cyclic code may be constructed and analyzed by using an algebraic method, and various practical decoding methods may be found; and second, due to a cyclic characteristic of the cyclic code, an encoding operation and an adjoint calculation may be implemented by using a feedback shift register.

As used in this specification, the term "codeword symbol" or "symbol" refers to a basic unit that constitutes a cyclic code, and is also a basic unit for performing encoding and decoding calculation. Generally, a letter m is used to represent a quantity of bits included in one symbol, where m is a positive integer greater than or equal to 1. For a BCH code, a CRC code, a fire code, or the like, a value of m is usually 1. To be specific, in this case, a basic unit of cyclic code composition and encoding is bit. For an RS code, a value of m is usually greater than 1.

In the embodiments of the present disclosure, four parameters (N, K, T, m) are used to describe the cyclic code. N represents a length of a cyclic code, that is, a quantity of included symbols; K represents a length of a payload of a cyclic code, that is, a quantity of symbols included in a payload part; and T represents an error correction capability of a cyclic code, that is, one cyclic code can correct errors of a maximum of T symbols. N, K, and T are positive integers greater than or equal to 1, and N is greater than K.

As briefly mentioned above, an encoding architecture is strictly bound to a throughput capability, and is not flexible. Generally, for a scenario that has a plurality of throughput capability requirements, a maximum throughput capability is usually required for design. In addition, a time division and space division conversion module is used to perform time division multiplexing on an encoder resource. FIG. 1 shows a scenario 100 of a spatial-temporal multiplexing encoding architecture by using a throughput capability of 800 Gbps as an example. It is assumed that a device 110 includes service data streams at 4 ports, that is, a service data stream 101 at a port A, a service data stream 102 at a port B, a service data stream 103 at a port C, and a service data stream 104 at a port D shown in FIG. 1. A rate of each data stream is 200 Gbps, that is, a data volume of an entire large port is 800 Gbps. Therefore, the device 110 includes an encoder 130 with a throughput capability of 1×800 G. However, the encoder 130 cannot encode different data streams simultaneously. Therefore, a conversion module 120 configured to perform time division and space division conversion distinguishes, buffers, and distributes data streams at different ports, to ensure that data sent to the encoder 130 at a same moment is from a same service.

Figure 2:
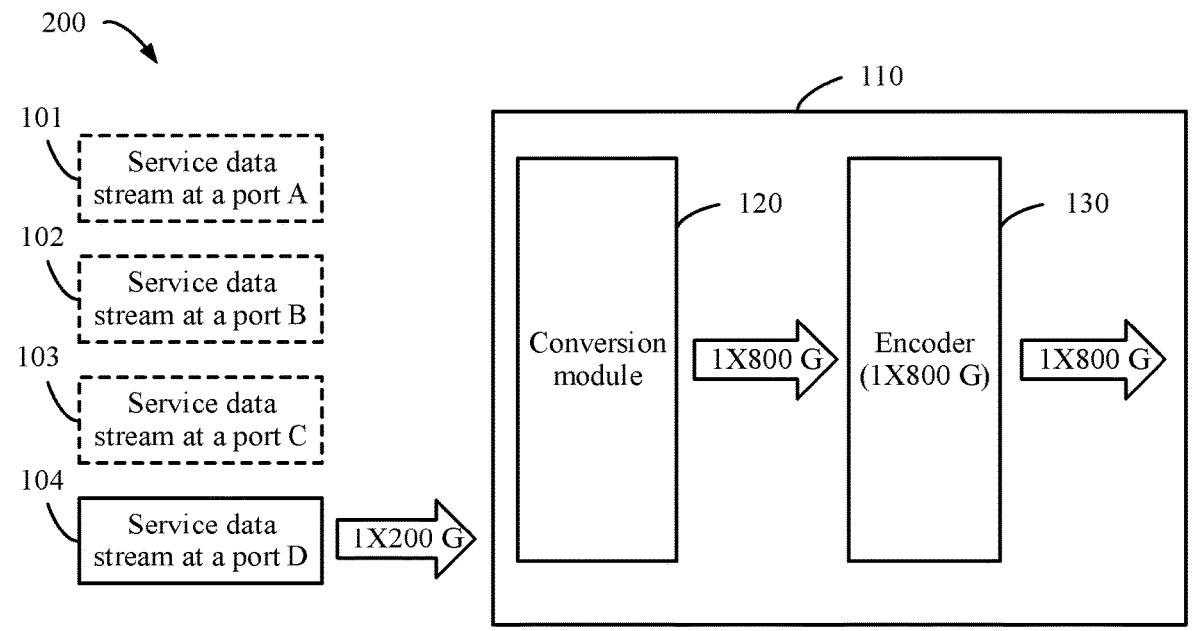
FIG. 2 is another scenario of a spatial-temporal multiplexing encoding architecture for cyclic code encoding.

FIG. 2 shows another scenario 200 of the spatial-temporal multiplexing encoding architecture in FIG. 1. In the scenario 200, ports A, B, and C have no data stream, that is, are in an idle mode. Although a total rate of the data stream is only 200 Gbps in this case, because a processing capability of the encoder is still 800 Gbps, to align the processing capability of the encoder in a unit time, the conversion module 120 needs to complete accumulation of data volumes in 4 unit times. In other words, the conversion module 120 needs to buffer the service data stream 104 of the port D until the data volume reaches 800 G.

In this solution, the encoding architecture and the throughput capability of the encoder are required to be strictly bound, and are not flexible. In a scenario where a plurality of service data streams share an encoder, the encoder can be designed only based on a maximum service processing capability. In addition, a complex space division and time division conversion module is required. This increases implementation costs and delay of the encoder architecture, especially when some services are idle.

Figure 3:
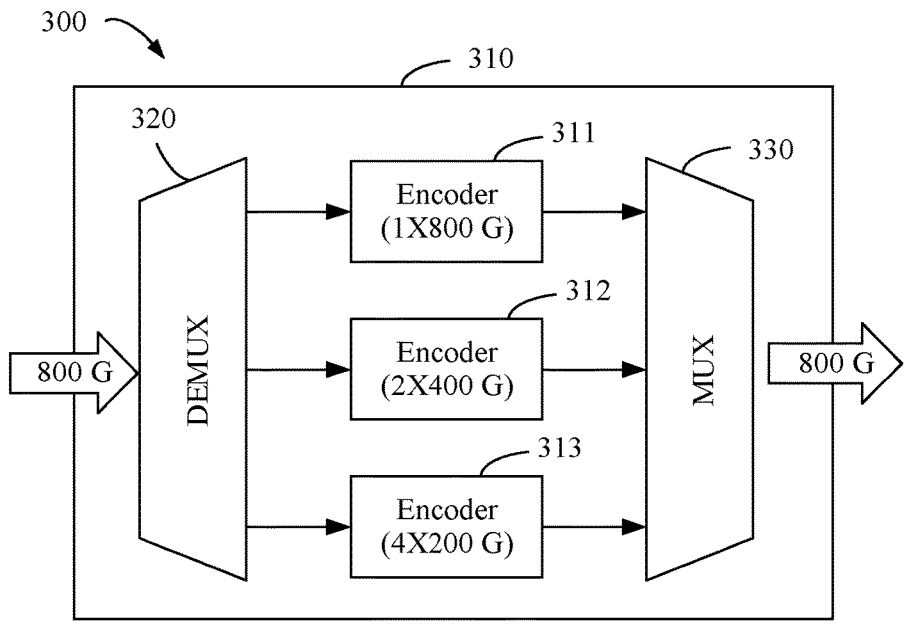
FIG. 3 is an encoder architecture for coexistence of multiple throughput capabilities for cyclic code encoding.

In another solution, for a delay-sensitive scenario, an encoder architecture in which a plurality of throughput capabilities coexist is used. In this solution, different encoder throughput capabilities are designed based on specific requirements, and then integrated into an encoding architecture to support a requirement of a plurality of data throughput capabilities. FIG. 3 shows an encoder architecture 300 in which a plurality of throughput capabilities coexist by using a throughput capability of 800 Gbps as an example. In the scenario of FIG. 3, a plurality of requirements such as 1×800 G, 2×400 G, and 4×200 G all need to be supported. Therefore, a device 310 includes an encoder 311 with a throughput capability of 1×800 G, an encoder 312 with a throughput capability of 2×400 G, and an encoder 313 with a throughput capability of 4×200 G. After to-be-encoded data is input into the device 310, a demultiplexer (DEMUX) 320 switches the to-be-encoded data to an encoder in a corresponding mode based on different requirements to complete an encoding operation. A multiplexer (MUX) 330 integrates encoded data.

In this solution, the encoder of each mode is designed all independently, and is not flexible. Different encoders cannot share resources, and therefore, area implementation costs are high. In addition, for an architecture of a high-throughput encoder, because a relatively large data bit width is required, a calculation amount that needs to be completed in a same clock cycle is significantly increased compared with that of a low-throughput encoder. Therefore, the entire architecture faces a technical risk that convergence cannot be performed at a high-speed clock frequency.

To solve at least some of the foregoing problems and other potential problems, an embodiment of the present disclosure provides a cyclic code encoding scheme. In general, a to-be-encoded payload symbol is split into a plurality of symbol sequences according to the various embodiments described herein. A plurality of split symbol sequences are separately encoded to obtain a plurality of parity sequences corresponding to the plurality of symbol sequences respectively. The plurality of parity sequences are combined into a parity symbol for the payload symbol, to form a cyclic code with the payload symbol. In this way, a small bit width cyclic code encoder may be used to implement large bit width cyclic code encoding. In this embodiment of the present disclosure, a large bit width encoder may be realized in a simple and flexible way.

For a better understanding of the cyclic code encoding scheme according to the present disclosure, an encoding process and characteristics of the cyclic code are first analyzed herein. For a cyclic code including K payload symbols and (N−K) parity symbols, a payload part M(x) may be represented as:

$$M(x) = m_{K-1} \cdot x^{K-1} + m_{K-2} \cdot x^{K-2} + \ldots + m_1 \cdot x + m_0 \quad (1)$$

$m_0, m_1, \ldots, m_{K-2},$ and $m_{K-1}$ represent $0^{th}$ to $(K-1)^{th}$ payload symbols.

A generator polynomial g(x) of the cyclic code may be represented as:

$$g(x) = g_{N-K} \cdot x^{N-K} + g_{N-K-1} \cdot x^{N-K-1} + \ldots + g_1 \cdot x + g_0 \quad (2)$$

The cyclic code encoding process may be represented as a process of obtaining a remainder p(x) by dividing M(x) by g(x). p(x) is a parity sequence of the cyclic code. A polynomial of the cyclic code including the payload symbol and the parity symbol includes M(x) and p(x).

$$x^{N-K} \cdot M(x) = q(x) \cdot g(x) + p(x) \quad (3)$$

Therefore, a polynomial C(x) of the cyclic code may be represented as:

$$C(x) = x^{N-K} \cdot M(x) + p(x) \quad (4)$$

To implement a flexible cyclic code encoding architecture, a to-be-encoded payload part M(x) needs to be split. One-level splitting of the payload part M(x) is used as an example, and the polynomial shown in formula (1) may be split based on odd and even terms, as shown in formula (5):

$$M(x) = \sum_{i=0} m_{2 \cdot i} \cdot x^{2 \cdot i} + \sum_{i=0} m_{2 \cdot i+1} \cdot x^{2 \cdot i+1} \quad (5)$$

$$= \sum_{i=0} m_{2 \cdot i} \cdot x^{2 \cdot i} + x \cdot \sum_{i=0} m_{2 \cdot i+1} \cdot x^{2 \cdot i}$$

$$= \sum_{i=0} (\sqrt{m_{2 \cdot i}} \cdot x^i)^2 + x \cdot \sum_{i=0} (\sqrt{m_{2 \cdot i+1}} \cdot x^i)^2$$

i is a positive integer ranging from 0 to (K/2−1).

According to a property of a finite field element operation, that is, "the sum of squares is equal to the sum squared", formula (5) may be further arranged into formula (6):

$$M(x) = \left(\sum_{i=0} \sqrt{m_{2 \cdot i}} \cdot x^i\right)^2 + x \cdot \left(\sum_{i=0} \sqrt{m_{2 \cdot i+1}} \cdot x^i\right)^2 \quad (6)$$

$$M_{even}(x) = \sum_{i=0} \sqrt{m_{2 \cdot i}} \cdot x^i, \text{ and } M_{odd}(x) = \sum_{i=0} \sqrt{m_{2 \cdot i+1}} \cdot x^i.$$

To be specific, $M_{even}(x)$ is related to an even-numbered symbol in the K payload symbols, and $M_{odd}(x)$ is related to an odd-numbered symbol in the K payload symbols.

Therefore, $M_{even}(x)$ and $M_{odd}(x)$ may be first encoded by using formula (3), to obtain parity sequences $P_{even}(x)$ and $P_{odd}(x)$ that correspond to $M_{even}(x)$ and $M_{odd}(x)$ respectively, as shown in formulas (8) and (9):

$$x^{2T} \cdot M(x) = q_{even}(x) \cdot g(x) + P_{even}(x) \quad (7)$$

$$x^{2T} \cdot M_{odd}(x) = q_{odd}(x) \cdot g(x) + P_{odd}(x) \quad (8)$$

Formula (3), (7), and (8) are used to obtain the following formula (9):

$$x^{2T} \cdot M(x) = x^{-2T} \cdot (x^{2T} \cdot M_{even}(x))^2 + x^{-2T} \cdot x \cdot (x^{2T} \cdot M_{odd}(x))^2 \quad (9)$$

$$= x^{-2T} \cdot (q_{even}^2(x) \cdot g^2(x) + P_{even}^2(x) + q_{odd}^2(x) \cdot g^2(x) + P_{odd}^2(x))$$

$$= x^{-2T} \cdot ((q_{even}^2(x) + q_{odd}^2(x)) \cdot g^2(x) + P_{even}^2(x) + P_{odd}^2(x))$$

Then, $P_{even}(x)$ and $P_{odd}(x)$ may be used to generate final (N−K) parity symbols, as shown in formula (10):

$$p(x) = (x^{2T} \cdot M(x)) \text{ MOD } g(x) = (x^{-2T} \cdot (P_{even}^2(x) + P_{odd}^2(x))) \text{ MOD } g(x) \quad (10)$$

It can be learned from the foregoing description that, in a case of one-level splitting, the K payload symbols may be divided into two symbol sequences by separately modulating 2 to 0 and 1 based on a power exponent of x. Similarly, in a case of performing two-level splitting on the payload part, the K payload symbols may be divided into four symbol sequences by separately modulating 4 to 0, 1, 2, and 3 based on the power exponent of x, and so on.

Figure 4:
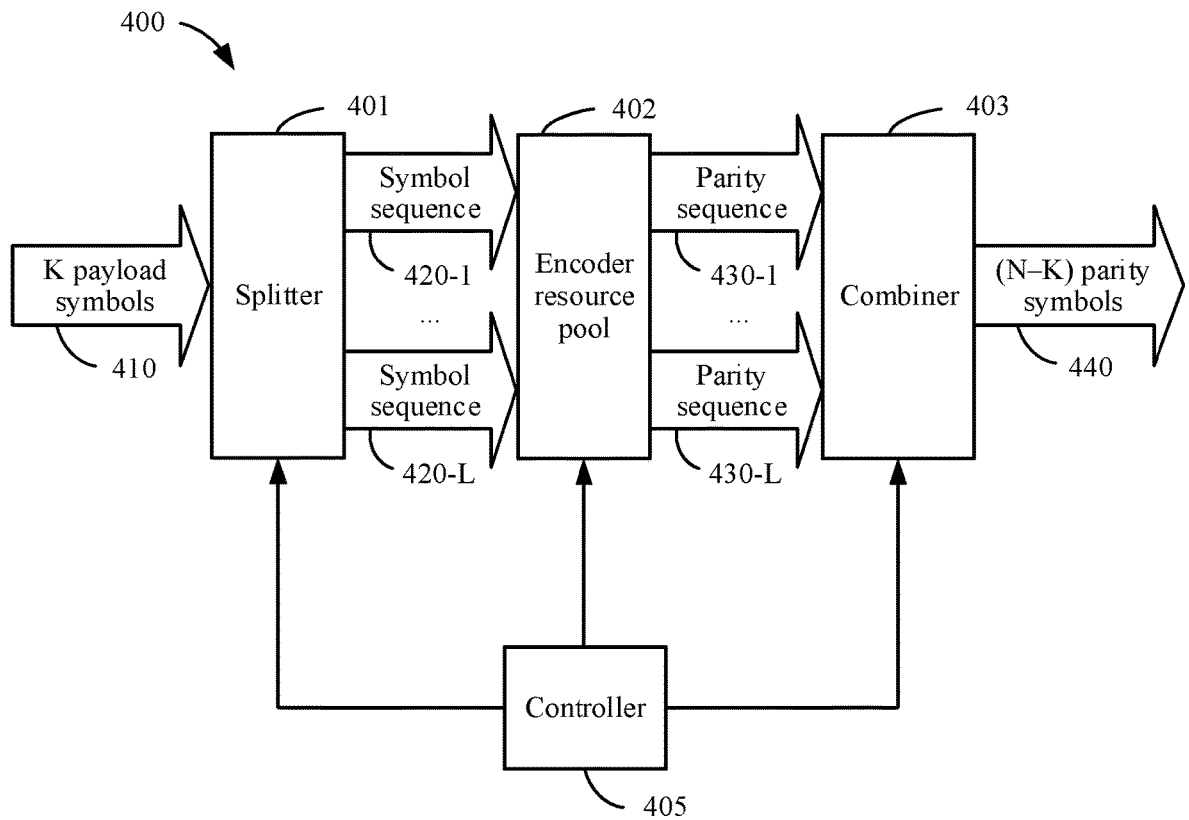
FIG. 4 is a schematic block diagram of a cyclic code encoding architecture according to some embodiments of the present disclosure.

FIG. 4 is a schematic block diagram of an architecture 400 for cyclic code encoding according to some embodiments of the present disclosure. As shown in FIG. 4, K to-be-encoded payload symbols 410 are input to a splitter 401. The splitter 401 generates a plurality of symbol sequences based on the K payload symbols. FIG. 4 shows that the splitter 401 generates L symbol sequences, where L is a positive integer greater than 1. Symbol sequences 420-1, ..., and 420-L may also be collectively referred to as L symbol sequences 420 or each may be referred to as a symbol sequence 420 in this specification. The L symbol sequences are related to symbols of different parts in the K payload symbols. In other words, the L symbol sequences are related to different subsets of the K payload symbols.

According to principles described with reference to the foregoing formula (1) to formula (10), when there are L split symbol sequences, $\log_2 L$-level splitting is performed on the K payload symbols. An $i^{th}$ symbol sequence in the L symbol sequences 420 is considered, where i is an integer ranging from 0 to (L−1). A $j^{th}$ symbol in the $i^{th}$ symbol sequence is related to an $(i+L*j)^{th}$ symbol in the K payload symbols, where j is an integer ranging from 0 to (K/L−1). As an example, when there are two split symbol sequences, one symbol sequence (for example, $M_{even}(x)$) generated by the splitter 401 is related to an even-numbered symbol in the K payload symbols, and a $j^{th}$ symbol in the symbol sequence is a square root of a $2*j^{th}$ symbol in the K payloads. Another symbol sequence (for example, $M_{odd}(x)$) generated by the splitter is related to an odd-numbered symbol in the K payload symbols, and a $j^{th}$ symbol in the symbol sequence is a square root of a $(2*j+1)^{th}$ symbol in the K payloads.

For another example, when there are four split symbol sequences, a $0^{th}$ symbol sequence is related to symbols numbered 0, 4, 8, and the like in the K payloads, and a $j^{th}$ symbol in the symbol sequence is a quadratic root of a $4*j^{th}$ symbol in the K payloads. A first symbol sequence is related to symbols numbered 1, 5, 9, and the like in the K payloads, and a $j^{th}$ symbol in the symbol sequence is a quadratic root of a $(4*j+1)^{th}$ symbol in the K payloads. A second symbol sequence is related to symbols numbered 2, 6, 10, and the like in the K payloads, and a $j^{th}$ symbol in the symbol sequence is a quadratic root of a $(4*j+2)^{th}$ symbol in the K payloads. A fourth symbol sequence is related to symbols numbered 3, 7, 11, and the like in the K payloads, and a $j^{th}$ symbol in the symbol sequence is a quadratic root of a $(4*j+3)^{th}$ symbol in the K payloads.

The L symbol sequences 420 are input to an encoder resource pool 402 including a plurality of encoders. Specifically, in the encoder resource pool 402, the L symbol sequences 420 are respectively processed by the L encoders, to generate corresponding L parity sequences. For example, an encoder generates a parity sequence 430-1 corresponding to the symbol sequence 420-1, and another encoder generates a parity sequence 430-L corresponding to the symbol sequence 430-L. The parity sequences 430-1, ..., and 430-L may also be collectively referred to as L parity sequences 430, or each may be referred to as a parity sequence 430 in this specification. As an example, in a case of one-level splitting (that is, L=2), the parity sequences 430-1 and 430-2 are $P_{even}(x)$ and $P_{odd}(x)$ shown in formula (7) and formula (8).

The L parity sequences 430 are then input to a combiner 403. The combiner 403 generates (N−K) parity symbols 440 of the cyclic code based on the L parity sequences 430. The generated (N−K) parity symbols 440 may be combined with the K payload symbols 410 into a complete cyclic code.

In some embodiments, the architecture 100 may further include a controller 405. In general, the controller 405 may be configured to: determine an encoding mode based on a data rate of to-be-encoded data, and set an operating mode of elements in the architecture, such as the splitter 401, the encoder resource pool 402, and the combiner 403, based on the encoding mode. In the example of FIG. 4, the controller 405 may determine whether a data rate (also referred to as a "first data rate") of to-be-encoded data (also referred to as a "first to-be-encoded data") including K payload symbols 410 exceeds a data rate threshold. The data rate threshold may be determined by a throughput capability of an individual encoder in the encoder resource pool 402. If the first data rate of the first to-be-encoded data exceeds the data rate threshold, the controller 405 determines that the architecture 400 is in a high throughput encoding mode. The controller 405 determines, based on the first data rate and the data rate threshold, a quantity of symbol sequences into which the K payload symbols are to be split. In the example of FIG. 4, the controller 405 determines that the K payload symbols are to be split into L symbol sequences. The controller 405 may further generate a control instruction for the splitter 401, the encoder resource pool 402, and the combiner 403 to indicate a high throughput mode. The control instruction enables the splitter 401, the encoder resource pool 402, and the combiner 403 to complete the operations described above.

As an example, it is assumed that the throughput capability of the individual encoder in the encoder resource pool 402 is 400 Gbs. If the data rate of the first to-be-encoded data including the K payload symbols is 800 Gbs, for example, a data rate of a port service is 800 Gbs, the K payload symbols are to be split into two symbol sequences. For another example, if the data rate of the first to-be-encoded data is 1600 Gbs, the K payload symbols are to be split into four symbol sequences.

An example of an overall architecture for cyclic code encoding according to an embodiment of the present disclosure is described above with reference to FIG. 4. The splitter 401 and the combiner 403 may be implemented in any suitable manner. In some embodiments, the splitter 401 may include a plurality of sub-splitters operating independently. For example, one sub-splitter may be configured to split a plurality of payload symbols into two symbol sequences, namely, the sub-splitter operates in a case of one-level splitting. Another sub-splitter may be configured to split a plurality of payload symbols into four symbol sequences, namely, the sub-splitter operates in a case of two-level splitting. Similarly, the combiner 403 may include a plurality of sub-combiners operating independently. For example, one sub-combiner may be configured to combine two parity sequences corresponding to two symbol sequences respectively into a final parity symbol, that is, the sub-combiner operates in a case of one-level splitting. Another sub-combiner may be configured to combine four parity sequences corresponding to the four symbol sequences respectively into a final parity symbol, that is, the sub-combiner operates in a case of two-level splitting.

In some embodiments, the splitter 401 and the combiner 403 may have or be configured in a multi-level structure. The splitter 401 may include a plurality of sub-splitters, and these sub-splitters may be configured to form a multi-level sub-splitter. Similarly, the combiner 403 may include a plurality of sub-combiners, and these sub-combiners may be configured to form a multi-level sub-combiner.

Figure 5:
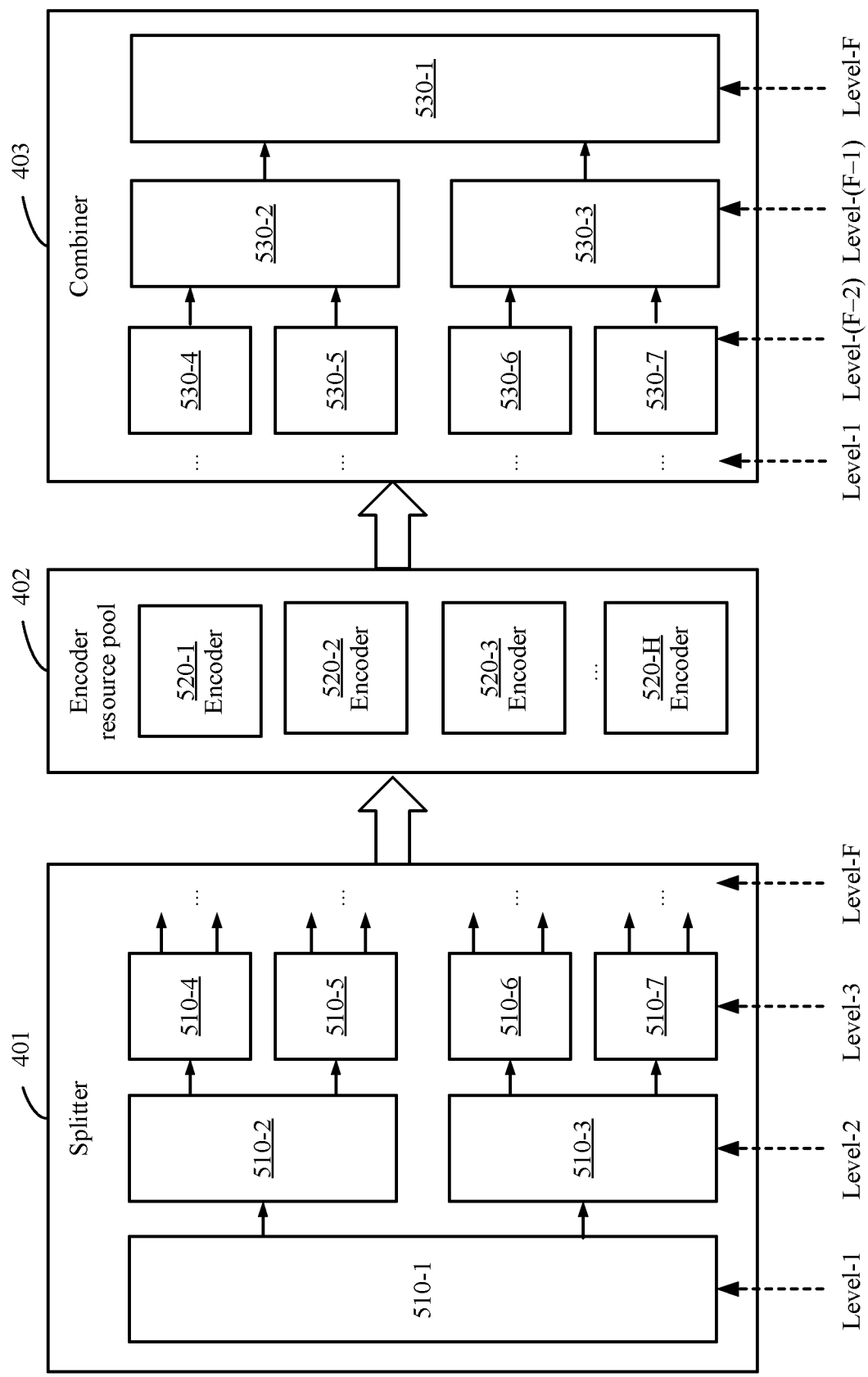
FIG. 5 is a schematic block diagram of a splitter and a combiner each including a multi-level structure according to some embodiments of the present disclosure.

FIG. 5 is a schematic block diagram of a splitter and a combiner each including a multi-level structure according to some embodiments of the present disclosure. As shown in FIG. 5, the splitter 401 includes a plurality of sub-splitters 510-1, 510-2, 510-3, 510-4, 510-5, 510-6, 510-7, and the like, which are also collectively referred to as a plurality of sub-splitters 510 or each may be referred to as a sub-splitter 510. The sub-splitter 510 receives a symbol from an input end of the splitter 401 or from a previous-level sub-splitter, and splits the received symbol into two symbol sequences. For example, a level-1 sub-splitter 510-1 splits a plurality of input payload symbols into two level-1 symbol sequences. A level-2 sub-splitter 510-2 receives one of two level-1 symbol sequences, and splits the received level-1 symbol sequence into two level-2 symbol sequences, and so on. It can be seen from the following description with reference to FIG. 6 and FIG. 8 that each sub-splitter substantially performs a same operation, and may be implemented by a same module. Therefore, the multi-level structure of the splitter 510 may be considered as a cyclic iteration architecture.

In some embodiments, multi-level structures of the plurality of sub-splitters 510 may be formed in advance. Alternatively, in some other embodiments, the multi-level structure of the plurality of sub-splitters 510 may be configured in operation. For example, the controller 405 may configure at least some of the plurality of sub-splitters 510 to form the multi-level structure.

In operation, the sub-splitter 510 in the splitter 401 may be enabled based on the quantity L of symbol sequences into which K to-be-encoded payload symbols are split. Specifically, a $\log_2$ L-level sub-splitter may be enabled, and other sub-splitters may be disabled. For example, when L=2, that is, in a case of one-level splitting, the level-1 sub-splitter 510-1 is used, and other sub-splitters such as 510-2, 510-3, 510-4, 510-5, 510-6, and 510-7 are disabled. For another example, when L=4, that is, in a case of two-level splitting, the level-1 sub-splitter 510-1 and the level-2 sub-splitter 510-2 and 510-3 are used, and other sub-splitters such as 510-4, 510-5, 510-6, and 510-7 are disabled. Enabling and disabling of the sub-splitter 510 may be implemented by using a control instruction or a control signal generated by the controller 405.

To process the plurality of symbol sequences generated by the splitter 401, the encoder resource pool 402 may include a plurality of encoders 520-1, 520-2, 520-3, . . . , and 520-H, which may also be collectively referred to as H encoders 520 or each may be referred to as an encoder 520. The H encoders 520 may have a same throughput capability. In addition, a quantity of encoders 520 included in the encoder resource pool 402 is associated with a maximum quantity of levels F that can be formed by the sub-splitter 510. Specifically, $F=\log_2 H$.

In operation, L of the H encoders 520 may be enabled based on the quantity L of symbol sequences into which the K payload symbols are split. Each enabled encoder generates a parity sequence corresponding to the symbol sequence based on one symbol sequence received from the splitter 401. A quantity of parity symbols included in the parity sequence generated by the encoder 520 is (N−K). Enabling and disabling of the encoder 520 may be implemented by using a control instruction or a control signal generated by the controller 405.

In addition, it should be understood that a plurality of encoders may operate cooperatively or independently. In addition, the encoder resource pool 402 may further include other encoders that have a different throughput capability from the encoder 520.

Similar to the splitter 401, the combiner 403 includes a plurality of sub-combiners 530-1, 530-2, 530-3, 530-4, 530-5, 530-6, 530-7, and the like, which are also collectively referred to as a plurality of sub-combiners 530 or each may be referred to as a sub-combiner 530. The sub-combiner 530 receives two parity sequences from an input end of the combiner 403 or from a previous-level sub-combiner, and combines the received two parity sequences into one parity sequence. For example, a level-1 sub-combiner receives two parity sequences generated by two sub-encoders respectively, and combines the two parity sequences into one parity sequence. By analogy, a last level, that is, a level-F sub-combiner 530-1 receives two parity sequences from the sub-combiner 530-2 and the sub-combiner 530-3 of level-(F−1), and combines the two parity sequences into final (N−K) parity symbols.

In some embodiments, the multi-level structure of the plurality of sub-combiners 530 may be formed in advance. Alternatively, in some other embodiments, the multi-level structure of the plurality of sub-combiners 530 may be configured in operation. For example, the controller 405 may configure at least some of the plurality of sub-combiners 530 to form the multi-level structure.

In operation, the sub-combiner 530 in the combiner 403 may be enabled based on the quantity L of symbol sequences into which K to-be-encoded payload symbols are split. Specifically, a $\log_2$ L-level sub-combiner may be enabled, and other sub-combiners may be disabled. For example, when L=2, that is, in a case of one-level splitting, the level-F sub-combiner 530-1 is used, and other sub-combiners such as 530-2, 530-3, 530-4, 530-5, 530-6, and 530-7 are disabled. For another example, when L=4, that is, in a case of two-level splitting, the level-F sub-combiner 530-1, and the sub-combiner 530-2 and the sub-combiner 530-3 of the level-(F−1) are enabled, and other sub-combiners such as 530-4, 530-5, 530-6, and 530-7 are disabled. Enabling and disabling of the sub-splitter 510 may be implemented by using a control instruction or a control signal generated by the controller 405.

Figure 7:
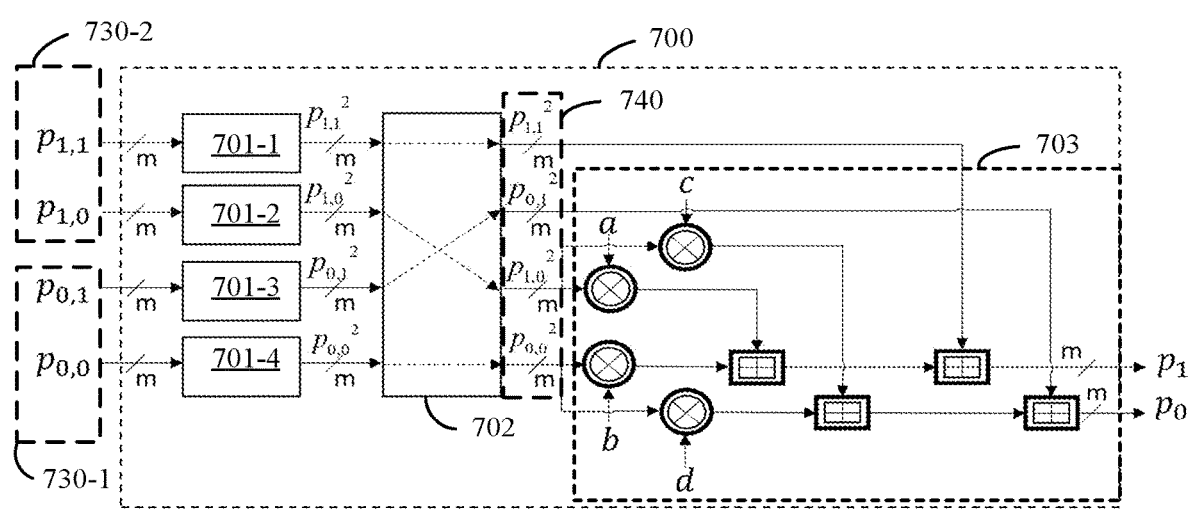
FIG. 7 is a schematic diagram of an example of a sub-combiner according to some embodiments of the present disclosure.
Figure 9:
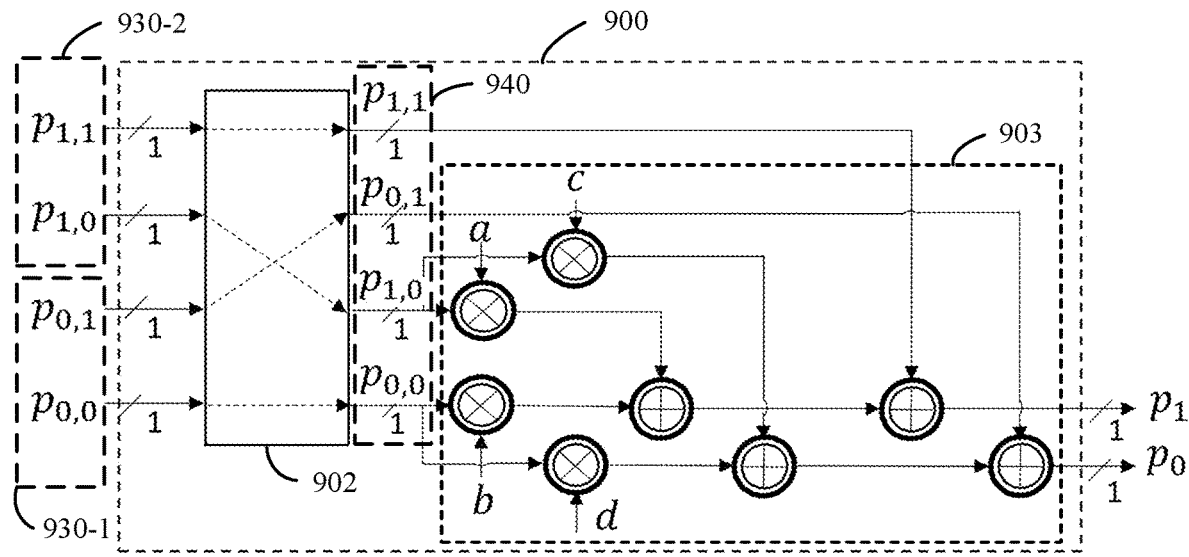
FIG. 9 is a schematic diagram of an example of a sub-combiner with a granularity of a single bit according to some embodiments of the present disclosure.

It can be seen from the following description with reference to FIG. 7 and FIG. 9 that each sub-combiner substantially performs a same operation, and may be implemented by a same module. Therefore, the multi-level structure of the combiner 530 may be considered as a cyclic iteration architecture. In some embodiments, a sub-combiner in the combiner 403 may be multiplexed based on a clock cycle required by the encoder 520 for encoding. In other words, in such an embodiment, a quantity of actually used sub-combiners may be less than a quantity of required sub-combiners. These actually used sub-combiners are configured to form a $\log_2$ L-level sub-combiner, to logically implement an operation of the $\log_2$ L-level sub-combiner. For example, when L=4, 3 sub-combiners may be logically required to form two levels. In practice, two sub-combiners can be used, one of which is reused as the level-1 sub-combiner and the level-2 sub-combiner. This multiplexing of the sub-splitter 510 may also be implemented by using a control instruction or a control signal generated by the controller 405. In this embodiment, multiplexing may be used to reduce a quantity of sub-combiners, thus reducing realization costs of the cyclic code encoding architecture.

By using a splitter and a combiner of a multi-level structure, a to-be-encoded payload symbol may be split into a plurality of symbol sequences based on an actual scenario. This can further improve flexibility of the cyclic code encoding structure. In addition, it should be understood that the quantity of sub-splitters and the level number of the sub-splitter, the quantity of encoders, the quantity of sub-combiners and the level number of the sub-combiner shown in FIG. 5 are all examples, and are not intended to limit the scope of the present disclosure. In this embodiment of the present disclosure, any suitable quantity of sub-splitters, encoders, and sub-combiners may be used, and these sub-splitters and sub-combiners may form different level numbers depending on a specific scenario.

Figure 6:
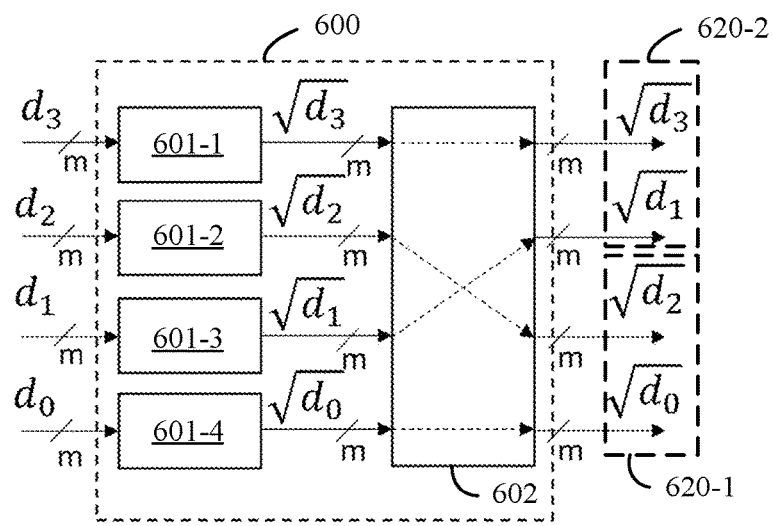
FIG. 6 is a schematic diagram of an example of a sub-splitter according to some embodiments of the present disclosure.

Some examples of the sub-splitter and the sub-combiner are described below with reference to FIG. 6 to FIG. 9. FIG. 6 is a schematic diagram of a sub-splitter 600 according to some embodiments of the present disclosure. For example, the sub-splitter 600 may be configured to implement any sub-splitter 510 shown in FIG. 5. "m" shown in FIG. 6 indicates that m bits are used as a granularity, that is, each symbol includes m bits. m is an integer greater than or equal to 1. For example, in a case of an RS code, m is 10.

Symbols $d_0$, $d_1$, $d_2$, and $d_3$ are input to the sub-splitter 600. The sub-splitter 600 splits the symbols $d_0$, $d_1$, $d_2$, and $d_3$ into symbol sequences 620-1 and 620-2. Specifically, the sub-splitter 600 generates a symbol sequence 620-1 based on a square root of even-numbered symbols $d_0$ and $d_2$, and generates a symbol sequence 620-2 based on a square root of odd-numbered symbols $d_1$ and $d_3$.

As shown in FIG. 6, the sub-splitter 600 includes a selector 602 and a plurality of root operators 601-1, 601-2, 601-3, and 601-4, which are also collectively referred to as a plurality of root operators 601 or each may be referred to as a root operator 601. Each root operator 601 is configured to generate a square root of a received symbol. Specifically, the root operator 601-1 generates a square root of the symbol $d_3$ as a symbol $\sqrt{d_3}$, the root operator 601-2 generates a square root of the symbol $d_2$ as a symbol $\sqrt{d_2}$, the root operator 601-3 generates a square root of the symbol $d_1$ as a symbol $\sqrt{d_1}$, and the root operator 601-4 generates a square root of the symbol $d_0$ as a symbol $\sqrt{d_0}$. The generated symbol is input to the selector 602. The selector 602 selects even-numbered symbols $\sqrt{d_0}$ and $\sqrt{d_2}$ as the symbol sequence 620-1, and selects odd-numbered symbols $\sqrt{d_1}$ and $\sqrt{d_3}$ as the symbol sequence 620-2.

In the example of FIG. 6, the sub-splitter 600 first performs a square root operation on an input symbol, and then combines, by using the selector 602, the even-numbered symbols into a symbol sequence, and combines the odd-numbered symbols into another symbol sequence. It should be understood that this is merely an example. In some other embodiments, the selector 602 may be arranged before a plurality of root operators 601-1, 601-2, 601-3, and 601-4. To be specific, in this embodiment, the input symbols are first divided into two different symbol sequences, and then a square root operation is performed on each symbol.

A splitting operation described above with reference to FIG. 6 may be considered as a general operation of the sub-splitter. The symbols $d_0$, $d_1$, $d_2$, and $d_3$ may represent to-be-encoded payload symbols or a part thereof, or may represent symbol sequences or a part thereof generated by a previous-level sub-splitter. When the symbols $d_0$, $d_1$, $d_2$, and $d_3$ represent to-be-encoded payload symbols or a part thereof on which one-level splitting is performed, the symbol sequences 620-1 and 620-2 are input to different encoders respectively, and each encoder generates a corresponding parity sequence. In a case of next-level splitting, the symbol sequences 620-1 and 620-2 are respectively input to two next-level sub-splitters to perform a similar splitting operation.

FIG. 7 is a schematic diagram of a sub-combiner 700 according to some embodiments of the present disclosure. For example, the sub-combiner 700 may be configured to implement any sub-combiner 530 shown in FIG. 5. Two parity sequences 730-1 and 730-2 are input to the sub-combiner 700. The parity sequence 730-1 includes parity symbols $p_{0,0}$ and $p_{0,1}$, and the parity sequence 730-2 includes parity symbols $p_{1,0}$ and $p_{1,1}$. The sub-combiner 700 generates parity symbols $p_0$ and $p_1$ based on the parity sequences 730-1 and 730-2. It can be seen that in the example of FIG. 7, (N−K) is equal to 2. Specifically, the sub-combiner 700 generates a rearranged parity sequence 740 based on the parity sequences 730-1 and 730-2, and then generates parity symbols $p_0$ and $p_1$ based on the rearranged parity sequence 740 and a generator polynomial of the cyclic code.

As shown in FIG. 7, the sub-combiner 700 includes a converter 703, a selector 702, and a plurality of square operators 701-1, 701-2, 701-3, and 701-4, which are also collectively referred to as a plurality of square operators 701 or each may be referred to as a square operator 701. Each square operator 701 is configured to generate a square of a received symbol. Specifically, the square operator 701-1 generates a square of the parity symbol $p_{1,1}$ as a symbol $P_{1,1}^2$, the square operator 701-2 generates a square of the parity symbol $p_{1,0}$ as a symbol $p_{1,0}^2$, the square operator 701-3 generates a square of the parity symbol $p_{0,1}$ as a symbol $p_{0,1}^2$, and the square operator 701-4 generates a square of the parity symbol $p_{0,0}$ as a symbol $p_{0,0}^2$.

The symbols $p_{0,0}^2$ and $p_{0,1}^2$ related to the parity sequence 730-1 and the symbols $p_{1,0}^2$ and $p_{1,1}^2$ related to the parity sequence 730-2 are all input to the selector 702. The selector 702 is configured to arrange symbols related to the parity sequence 730-1 and symbols related to the parity sequence 730-2 in an interleaved manner, to obtain the rearranged parity sequence 740. In the rearranged parity sequence 740, squares of parity symbols in the parity sequence 730-1 and squares of parity symbols in the parity sequence 730-2 are arranged in an interleaved manner. For example, in the rearranged parity sequence 740, a square of one parity symbol $p_{1,0}$ in the parity sequence 730-2 is arranged between squares $p_{0,0}$ and $p_{0,1}$ of two adjacent parity symbols $p_{0,0}$ and $p_{0,1}$ in the parity sequence 730-1.

The rearranged parity sequence 740 is input to the converter 703. The converter 703 is configured to generate parity symbols $p_0$ and $p_1$ based on the rearranged parity sequence 740 and the generator polynomial of the cyclic code. The converter 703 includes various suitable finite field operations (for example, addition and multiplication) to implement a linear transformation as shown in formula (10). Parameters a, b, c, and d of the finite field operation are related to parameters N, K, T, and m.

In the example of FIG. 7, the sub-combiner 700 first performs a square operation on an input parity symbol, and then forms a rearranged parity sequence 740 by using the selector 702. It should be understood that this is merely an example. In some other embodiments, the selector 702 may be arranged before a plurality of square operators 701-1, 701-2, 701-3, and 701-4. To be specific, in this embodiment, two input parity sequences are first rearranged into one parity sequence, and then a square operation is performed on each parity symbol.

A combination operation described above with reference to FIG. 7 may be considered as a general operation of the sub-combiner. The parity sequences 730-1 and 730-2 may represent parity sequences generated by two encoders respectively, or may represent parity sequences generated by a previous-level sub-combiner. When the parity sequences 730-1 and 730-2 represent parity sequences generated by two encoders respectively, and one-level combination is performed, generated parity symbols $p_0$ and $p_1$ are final parity symbols of the cyclic code (N, K, T, m). In a case of next-level combination, the generated parity symbols $p_0$ and $p_1$ are input to a next-level sub-combiner as a parity sequence, to perform a similar combination operation with another parity sequence.

An example sub-splitter shown in FIG. 6 and an example sub-combiner shown in FIG. 7 have a wide application scope, and may be used for cyclic code encoding with a granularity of a single bit, or may be used for cyclic code encoding with a granularity of a plurality of bits. When a single bit is used as a granularity (that is, m=1), structures of the sub-splitter and the sub-combiner may be further simplified.

Figure 8:
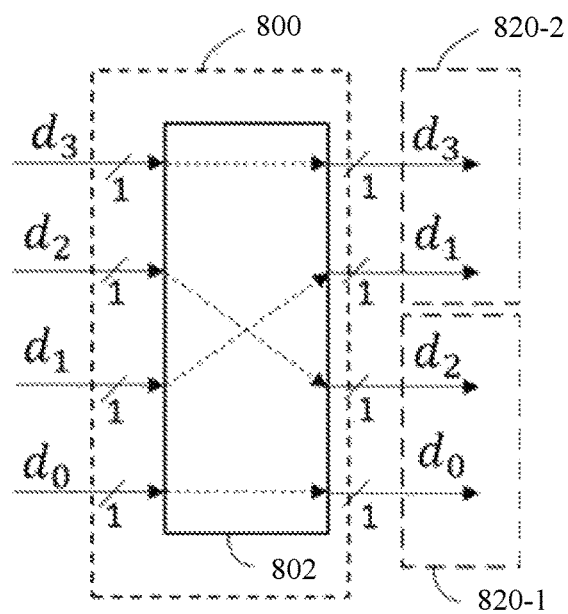
FIG. 8 is a schematic diagram of an example of a sub-splitter with a granularity of a single bit according to some embodiments of the present disclosure.

FIG. 8 is a schematic diagram of a sub-splitter 800 with a granularity of a single bit according to some embodiments of the present disclosure. "1" shown in FIG. 8 indicates that a single bit is used as a granularity, that is, each symbol includes 1 bit. For example, when the cyclic code is CRC code or BH code, the sub-splitter 800 may be configured to implement any sub-splitter 510 shown in FIG. 5.

Symbols $d_0$, $d_1$, $d_2$, and $d_3$ are input to the sub-splitter 800. The sub-splitter 800 splits symbols $d_0$, $d_1$, $d_2$, and $d_3$ into symbol sequences 820-1 and 820-2. In view of a feature of the granularity of a single bit, that is, square roots of "0" and "1" are their own, the sub-splitter 800 may not include a root operator, but only a selector 802. The selector 802 selects even-numbered symbols $d_0$ and $d_2$ as the symbol sequence 820-1, and selects odd-numbered symbols $d_1$ and $d_3$ as the symbol sequence 820-2.

A splitting operation described above with reference to FIG. 8 may be considered as a general operation of the sub-splitter. The symbols $d_0$, $d_1$, $d_2$, and $d_3$ may represent to-be-encoded payload symbols or a part thereof, or may represent symbol sequences or a part thereof generated by a previous-level sub-splitter. When the symbols $d_0$, $d_1$, $d_2$, and $d_3$ represent to-be-encoded payload symbols or a part thereof on which one-level splitting is performed, the symbol sequences 820-1 and 820-2 are input to different encoders respectively, and each encoder generates a corresponding parity sequence. In a case of next-level splitting, the symbol sequences 820-1 and 820-2 are respectively input to two next-level sub-splitters to perform a similar splitting operation.

FIG. 9 is a schematic diagram of a sub-combiner 900 with a granularity of a single bit according to some embodiments of the present disclosure. For example, when the cyclic code is CRC code or BH code, the sub-combiner 900 may be configured to implement any sub-combiner 530 shown in FIG. 5. Two parity sequences 930-1 and 930-2 are input to the sub-combiner 900. The parity sequence 930-1 includes parity symbols $p_{0,0}$ and $p_{0,1}$, and the parity sequence 930-2 includes parity symbols $p_{1,0}$ and $p_{1,1}$. The sub-combiner 900 generates parity symbols $p_0$ and $p_1$ based on the parity sequences 930-1 and 930-2. It can be seen that in the example of FIG. 9, (N–K) is equal to 2. Specifically, the sub-combiner 900 generates a rearranged parity sequence 940 based on the parity sequences 930-1 and 930-2, and then generates parity symbols $p_0$ and $p_1$ based on the rearranged parity sequence 940 and a generator polynomial of the cyclic code.

In view of a feature of the granularity of a single bit, that is, squares of "0" and "1" are their own, the sub-combiner 900 may not include a square operator. As shown in FIG. 9, the sub-combiner 900 includes a selector 902 and a converter 903. Each square operator 701 is configured to generate a square of a received symbol. Specifically, the square operator 701-1 generates a square of the parity symbol $p_{1,1}$ as a symbol $p_{1,1}^2$, the square operator 701-2 generates a square of the parity symbol $p_{1,0}$ as a symbol $p_{1,0}^2$, the square operator 701-3 generates a square of the parity symbol $p_{0,1}$ as a symbol $p_{0,1}^2$, and the square operator 701-4 generates a square of the parity symbol $p_{0,0}$ as a symbol $p_{0,0}^2$.

Parity symbols $p_{0,0}$ and $p_{0,1}$ in the parity sequence 930-1 and parity symbols $p_{1,0}$ and $p_{1,1}$ in the parity sequence 930-2 are all input to the selector 902. The selector 902 is configured to arrange the parity symbols in the parity sequence 930-1 and the parity symbols in the parity sequence 930-2 in an interleaved manner, to obtain a rearranged parity sequence 940. In the rearranged parity sequence 940, the parity symbols in the parity sequence 930-1 and the parity symbols in the parity sequence 930-2 are arranged in an interleaved manner. For example, in the rearranged parity sequence 940, one parity symbol $p_{1,0}$ in the parity sequence 930-2 is arranged between two adjacent parity symbols $p_{0,0}$ and $p_{0,1}$ in the parity sequence 930-1.

The rearranged parity sequence 940 is input to the converter 903. The converter 903 is configured to generate parity symbols $p_0$ and $p_1$ based on the rearranged parity sequence 940 and the generator polynomial of the cyclic code. The converter 903 includes various suitable finite field operations (for example, addition and multiplication) to implement a linear transformation as shown in formula (10). Parameters a, b, c, and d of the finite field operation are related to parameters N, K, T, and m.

Figure 10:
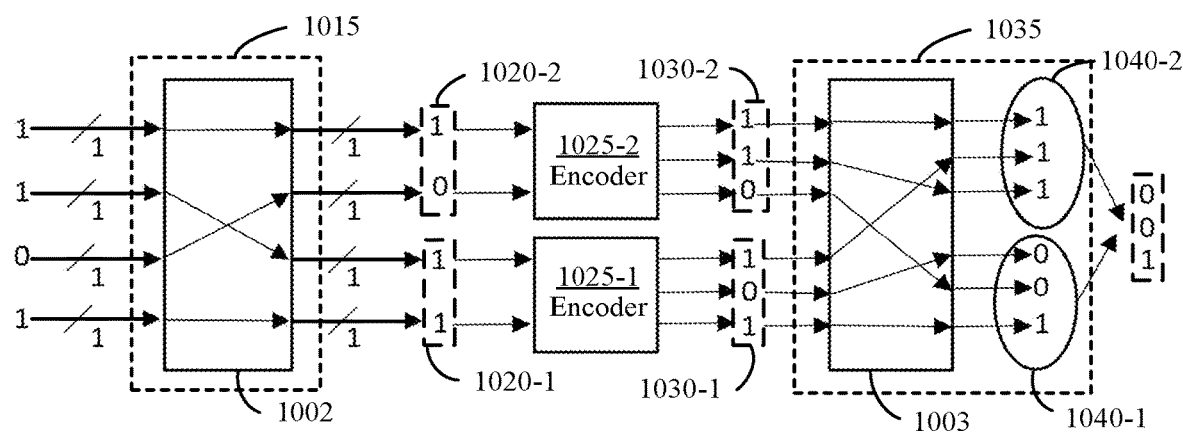
FIG. 10 is a schematic diagram of a cyclic code encoding scheme with a granularity of a single bit according to some embodiments of the present disclosure.

Examples of the sub-splitter and the sub-combiner are described above separately with reference to FIG. 6 to FIG. 9. The following uses a CRC code (namely, a CRC-3 code) in which (N–K)=3 as an example to describe a specific example of a cyclic code encoding scheme with reference to FIG. 10. FIG. 10 is a schematic diagram of a cyclic code encoding scheme with a granularity of a single bit according to some embodiments of the present disclosure.

For the purpose of illustration only and without any limitation, it is assumed that a generator polynomial of CRC-3 is $g(x)=x^3+x+1$. A matrix G used for a combination operation may be obtained according to the generator polynomial $g(x)$, as shown in formula (11):

$$G = \begin{pmatrix} 1 & 1 & 1 \\ 0 & 1 & 1 \\ 1 & 1 & 0 \end{pmatrix} \quad (11)$$

For the purpose of illustration only and without any limitation, it is assumed herein that a payload symbol (namely, payload bits) is 1,1,0,1, which may be represented by using a polynomial shown in formula (12):

$$m(x)=1 \cdot x^3 + 1 x^2 + 0 \cdot x + 1 \quad (12)$$

According to a general calculation rule of CRC-3, an operation of dividing a polynomial $x^3 \cdot m(x)$ by $g(x)$ to obtain a remainder needs to be completed. Therefore, a final remainder $0 \cdot x^2 + 0 \cdot x + 1$ may be obtained, that is, 3 parity bits (0, 0, 1) are finally obtained. It should be specially noted that CRC calculation is performed in a finite field GF(2), and GF(2) includes only two elements: 0 and 1. Therefore, an addition operation and a subtraction operation in GF(2) are the same, that is, 1–0=1+0=1 and 0–1=0+1=1. A subtraction operation is involved in a polynomial division operation, for example, $$x^5+x^3-(x^4+x^2)=x^5+x^4+x^3+x^2 \cdot x^5+x^3-(x^4+x^3)=x^5+x^4 \quad (13)$$

A sum of two identical polynomials is 0, for example, x+x=0.

FIG. 10 shows a case of one-level splitting and one-level combination. As shown in FIG. 10, 4 payload bits 1, 1, 0, and 1 are input to a splitter 1015. The splitter 1015 splits the four payload bits (1, 1, 0, 1) into two bit sequences 1020-1 and 1020-2. Specifically, the selector 1002 selects an even-numbered bit as the bit sequence 1020-1, and selects an odd-numbered bit as the bit sequence 1020-2. The two bit sequences 1020-1 and 1020-2 are respectively input to encoders 1025-1 and 1025-2.

For the encoder 1025-2, input bits are (1,0), and a corresponding polynomial is $m_{odd}(x)=1 \cdot x+0$. Similar to the foregoing description, the encoder 1025-2 needs to complete calculation of dividing $x^3 \cdot m_{odd}(x)$ by $g(x)$ and then obtaining a remainder. A calculation result of the remainder is $1 \cdot x^2+1 \, x+0$, that is, a generated parity sequence 1030-2 includes bits (1, 1, 0).

Similarly, for the encoder 1025-1, input bits are (1,1), and a corresponding polynomial is $m_{even}(x)=1 \cdot x+1$. Similar to the foregoing description, the encoder 1025-1 needs to complete calculation of dividing $x^3 \cdot m_{even}(x)$ by $g(x)$ and then obtaining a remainder. A calculation result of the remainder is $1 \cdot x^2+0 \cdot x+1$, that is, a generated parity sequence 1030-1 includes bits (1, 0, 1).

The parity sequences 1030-1 and 1030-2 are input to a combiner 1035. The combiner 1035 generates final parity bits (0, 0, 1) based on the parity sequences 1030-1 and 1030-2. Specifically, both the parity bits (1, 0, 1) in the parity sequence 1030-1 and the parity bits (1, 1, 0) in the parity sequence 1030-2 are input to a selector 1003. The selector 1003 is configured to arrange parity bits in the parity sequence 1030-1 and parity bits in the parity sequence 1030-2 in an interleaved manner, to obtain a rearranged parity sequence. The rearranged parity sequence includes a least significant bit LSB 1040-1 and a most significant bit MSB 1040-2. It can be learned from FIG. 10 that, in the rearranged parity sequence, parity symbols in the parity sequence 1030-1 and parity symbols in the parity sequence 1030-2 are arranged in an interleaved manner.

Next, to generate a final parity bit, a converter (not shown) in the combiner 1035 completes an operation shown in formula (14).

$$\begin{pmatrix} 1 & 1 & 1 \\ 0 & 1 & 1 \\ 1 & 1 & 0 \end{pmatrix} \cdot \begin{pmatrix} 0 \\ 0 \\ 1 \end{pmatrix} \oplus \begin{pmatrix} 1 \\ 1 \\ 1 \end{pmatrix} = \begin{pmatrix} 1 \\ 1 \\ 0 \end{pmatrix} \oplus \begin{pmatrix} 1 \\ 1 \\ 1 \end{pmatrix} = \begin{pmatrix} 0 \\ 0 \\ 1 \end{pmatrix} \quad (14)$$

Specifically, three bits of the LSB 1040-1 are multiplied by the matrix G shown in the formula (11), and an exclusive OR operation is performed on a result of the multiplication and the MSB 1040-2 bit by bit. Therefore, three final parity bits (0, 0, 1) can be obtained. Although not shown, it should be understood that linear transformation shown in formula (14) may be implemented by various appropriate addition operations and multiplication operations.

The operation in a case of one-level splitting and one-level combination according to the embodiments of the present disclosure can be understood from the description with reference to FIG. 6 to FIG. 10. Now reference is made to FIG. 11 and FIG. 12 to describe a case of two-level splitting and two-level combination.

Figure 11:
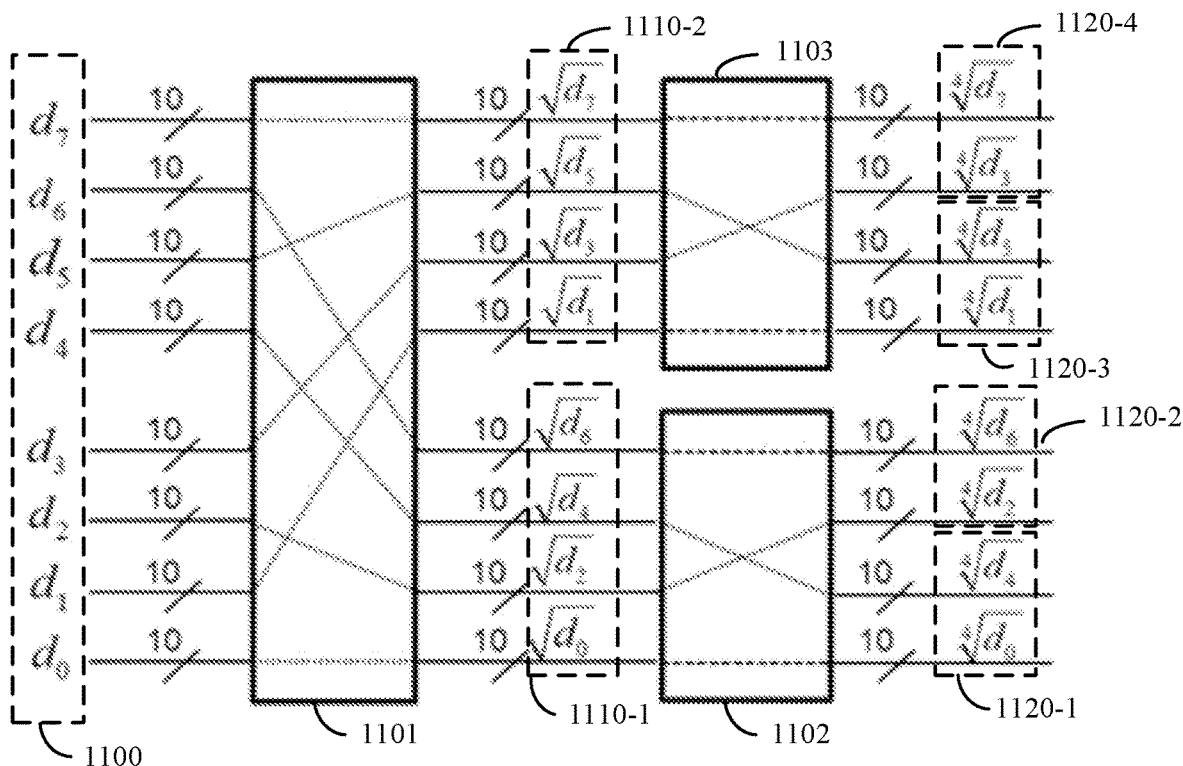
FIG. 11 is a schematic diagram of an example of two-level splitting according to some embodiments of the present disclosure.

FIG. 11 is a schematic diagram of an example of two-level splitting according to some embodiments of the present disclosure. "10" shown in FIG. 11 represents a case in which 10 bits are used as a granularity, that is, each symbol includes 10 bits, for example, an RS code. However, it should be understood that 10 bits are used only as an example in FIG. 11, and the scope of the present disclosure is not intended to be limited.

A plurality of to-be-encoded payload symbols 1100 are input to the sub-splitter 1101, which is used as a level-1 sub-splitter. The sub-splitter 1101 generates a primary symbol sequence 1110-1 based on even-numbered symbols in the plurality of payload symbols 1100, and generates another primary symbol sequence 1110-2 based on odd-numbered symbols. Specifically, the sub-splitter 1101 uses square roots of the even-numbered symbols in the plurality of payload symbols 1100 to form the primary symbol sequence 1110-1, and uses square roots of the odd-numbered symbols to form the primary symbol sequence 1110-2. The two primary symbol sequences: 1110-1 and 1110-2 are input to the sub-splitter 1102 and 1103 respectively. The sub-splitters 1102 and 1103 are used as level-2 sub-splitters.

The sub-splitter 1102 generates a secondary symbol sequence 1120-1 based on even-numbered symbols (namely, $\sqrt{d_0}$ and $\sqrt{d_4}$) in the primary symbol sequence 1110-1, and generates a secondary symbol sequence 1120-2 based on odd-numbered symbols (namely, $\sqrt{d_2}$ and $\sqrt{d_6}$) in the primary symbol sequence 1110-1. Similarly, the sub-splitter 1103 generates a secondary symbol sequence 1120-3 based on even-numbered symbols (that is, $\sqrt{d_1}$ and $\sqrt{d_5}$) in the primary symbol sequence 1110-2, and generates a secondary symbol sequence 1120-4 based on odd-numbered symbols (that is, $\sqrt{d_3}$ and $\sqrt{d_7}$) in the primary symbol sequence 1110-2. It should be understood that a number in the primary symbol sequence described herein is related to a position of a symbol in a corresponding sequence, and does not refer to a position in the payload symbol that is initially input.

Thereby, after two-level splitting, the plurality of payload symbols 1100 that are initially input are split into four symbol sequences, namely, secondary symbol sequences 1120-1, 1120-2, 1120-3, and 1120-4, to be input into four sub-encoders respectively. Sub-encoders 1101, 1102, and 1103 may be implemented in a manner similar to the sub-splitter 600 shown in FIG. 6. For example, each of the sub-encoders 1101, 1102, and 1103 may include a selector and a plurality of root operators.

Figure 12:
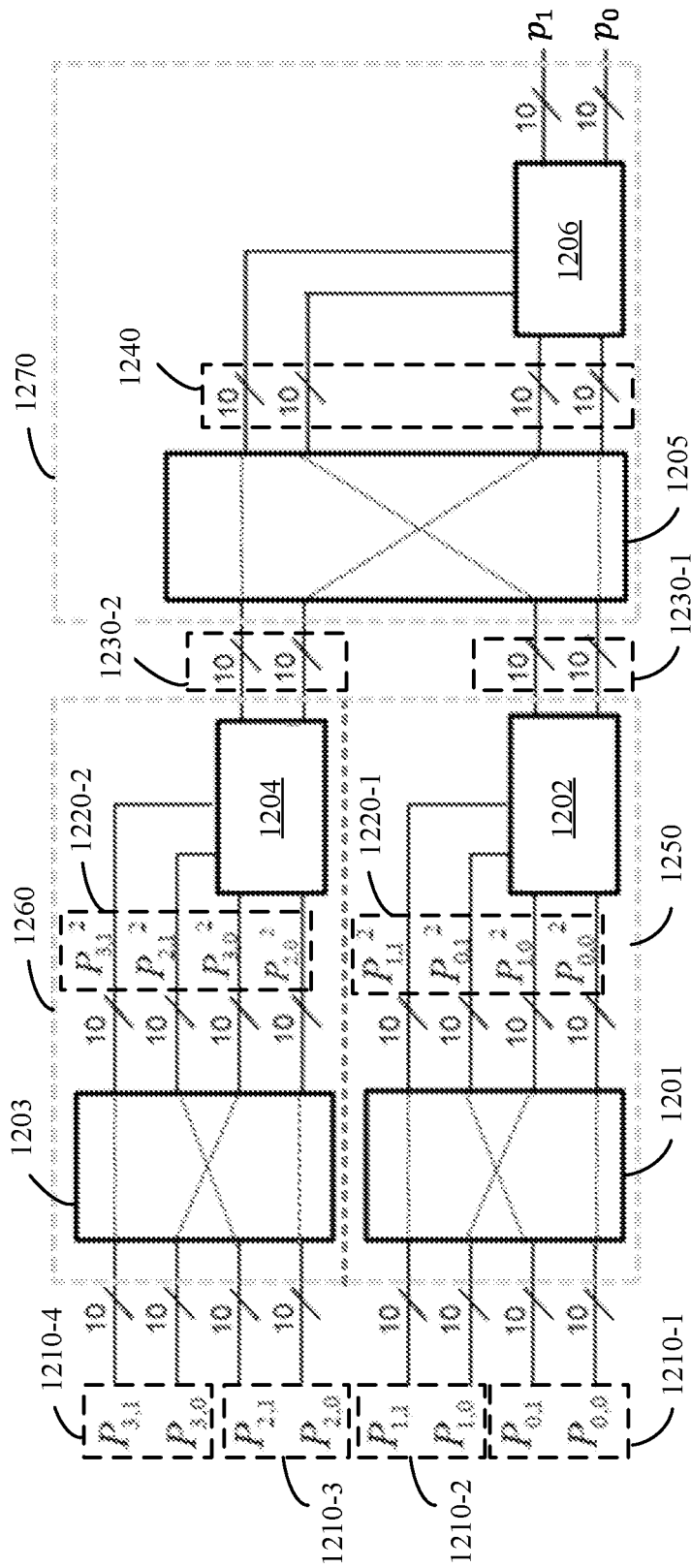
FIG. 12 is a schematic diagram of an example of two-level splitting according to some embodiments of the present disclosure.

FIG. 12 is a schematic diagram of an example of two-level combination according to some embodiments of the present disclosure. "10" shown in FIG. 12 represents a case in which 10 bits are used as a granularity, that is, each symbol includes 10 bits, for example, an RS code. However, it should be understood that 10 bits are used only as an example in FIG. 12, and the scope of the present disclosure is not intended to be limited.

As shown in FIG. 12, four parity sequences 1210-1, 1210-2, 1210-3, and 1210-3 are respectively generated by four encoders. The parity sequence 1210-1 corresponds to the symbol sequence 1120-1 shown in FIG. 11, the parity sequence 1210-2 corresponds to the symbol sequence 1120-2 shown in FIG. 11, the parity sequence 1210-3 corresponds to the symbol sequence 1120-3 shown in FIG. 11, and the parity sequence 1210-4 corresponds to the symbol sequence 1120-4 shown in FIG. 11. The parity sequences 1210-1 and 1210-2 are input to a same sub-combiner 1250. The parity sequences 1210-3 and 1210-4 are input to a same sub-combiner 1260. The sub-combiners 1250 and 1260 are used as level-1 sub-combiners.

The sub-combiner 1250 generates a primary combined sequence 1230-1 (a specific value is not shown in FIG. 12) based on the parity sequences 1210-1 and 1210-2 and a generator polynomial. Therefore, the sub-combiner 1250 includes a module 1201 that implements a square operation and a parity symbol rearrangement function. The module 1201 generates a rearranged parity sequence 1220-1 based on the parity sequences 1210-1 and 1210-2. The converter 1202 generates the primary combined sequence 1230-1 based on the rearranged parity sequence 1220-1 and the generator polynomial.

Similarly, the sub-combiner 1260 generates a primary combined sequence 1230-2 (a specific value is not shown in FIG. 12) based on the parity sequences 1210-3 and 1210-4 and the generator polynomial. Therefore, the sub-combiner 1260 includes a module 1203 that implements a square operation and a parity symbol rearrangement function. The module 1203 generates a rearranged parity sequence 1220-2 based on the parity sequences 1210-3 and 1210-4. The converter 1204 generates the primary combined sequence 1230-2 based on the rearranged parity sequence 1220-2 and the generator polynomial.

The primary combined sequences 1230-1 and 1230-2 are input to the sub-combiner 1270, which is used as a level-2 sub-combiner. The sub-combiner 1270 generates final parity symbols $p_0$ and $p_1$ based on the primary combined sequences 1230-1 and 1230-2 and the generator polynomial. Therefore, the sub-combiner 1270 includes a module 1205 that implements a square operation and a parity symbol rearrangement function. The module 1205 generates a rearranged parity sequence 1240 (a specific value is not shown in FIG. 12) based on the primary combined sequences 1230-1 and 1230-2. A converter 1206 generates final parity symbols $p_0$ and $p_1$ based on the rearranged parity sequence 1240 and the generator polynomial.

Although no specific structure is shown, the modules 1201, 1203, and 1205 may include a selector and a plurality of square operators as shown in FIG. 7. In addition, the converters 1202, 1204, and 1206 may be implemented by various suitable addition operations, multiplication operations, and the like based on a generator polynomial g(x) of a cyclic code.

In the cyclic code encoding scheme described above according to some embodiments of the present disclosure, a to-be-encoded payload symbol is split into a plurality of symbol sequences, and then parity sequences corresponding to the plurality of symbol sequences respectively are combined into a final parity symbol. In this manner, a small bit width (small degree of parallelism) cyclic code encoder may be used to implement large bit width (large degree of parallelism) cyclic code encoding. By introducing a data splitting operation and a data combination operation, a function same as a large bit width encoder can be implemented. This architecture facilitates high-speed clock convergence and greatly reduces technical difficulty and complexity of implementing the large bit width encoder.

Figure 13:
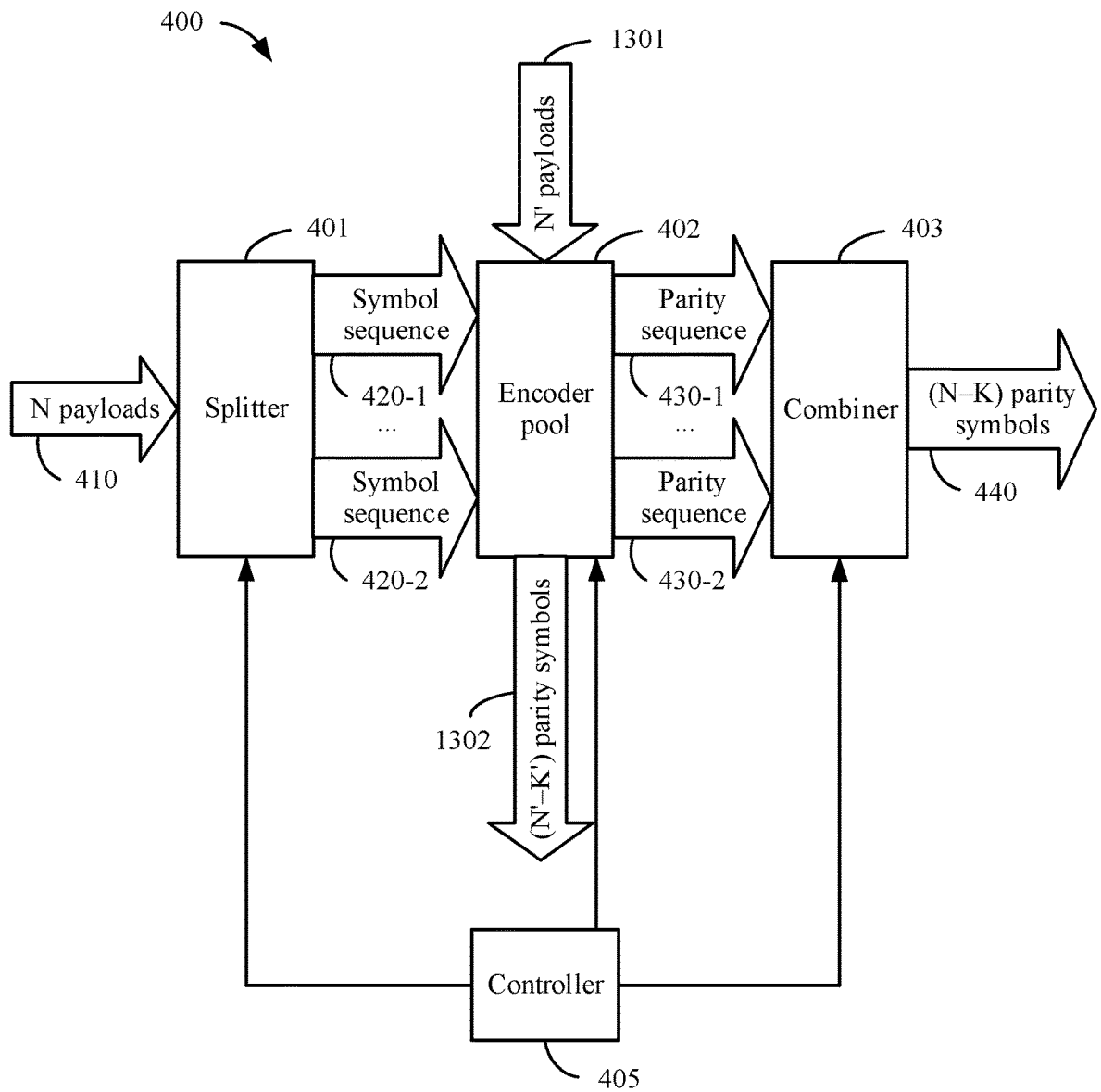
FIG. 13 is a schematic diagram of an architecture of cyclic code encoding in a low throughput mode according to some embodiments of the present disclosure.

In addition to the cyclic code encoding in a high throughput mode, in some embodiments, cyclic code encoding in a low throughput mode may also be supported. FIG. 13 is a schematic diagram of an architecture 400 of cyclic code encoding in a low throughput mode according to some embodiments of the present disclosure. As described above with reference to FIG. 4, a controller 405 is configured to determine an encoding mode based on a data rate of to-be-encoded data, and set an operating mode of an element in the architecture, such as a splitter 401, an encoder resource pool 402, and a combiner 403, based on the encoding mode.

In the example of FIG. 13, the controller 405 may determine whether a data rate (also referred to as a "second data rate") of to-be-encoded data (also referred to as "second to-be-encoded data") including K' payload symbols 1301 exceeds a data rate threshold. The data rate threshold may be determined by a throughput capability of an individual encoder in the encoder resource pool 402. If the second data rate of the second to-be-encoded data does not exceed the data rate threshold, the controller 405 determines that the architecture 400 is in the low throughput encoding mode. The controller 405 may further generate a control instruction for the splitter 401, the encoder resource pool 402, and the combiner 403 to indicate a low throughput mode. The control instruction disables or turns off the splitter 401 and the combiner 403. The control instruction further enables an encoder in the encoder resource pool 402, and the encoder independently generates corresponding (N'—K') parity symbols 1302 based on the K' payload symbols 1301.

As an example, it is assumed that the throughput capability of the individual encoder in the encoder resource pool 402 is 400 Gbs. If the data rate of the second to-be-encoded data including K' payload symbols is 400 Gbs, for example, a data rate of a port service is 400 Gbs, the K' payload symbols are directly input to an encoder, to generate (N'—K') parity symbols.

In some embodiments, the architecture 400 may also directly perform spatial-temporal conversion or spatial-temporal multiplexing. When the data rate of the second to-be-encoded data is less than the data rate threshold, that is, less than the throughput capability of the encoder, the second to-be-encoded data transferred over time may be first buffered. In response to a case in which a data amount of the buffered second to-be-encoded data matches the data rate threshold, the stored second to-be-encoded data is input to the encoder. Therefore, the encoder generates (N'—K') parity symbols based on the K' payload symbols. For example, the architecture 400 may further include a space division-time division conversion module (for example, implemented by a memory, a register, and the like) to perform the spatial-temporal conversion described herein.

As an example, it is still assumed that the throughput capability of the individual encoder in the encoder resource pool 402 is 400 Gbs. If the data rate of the second to-be-encoded data that includes the K' payload symbols is 200 Gbs, for example, a data rate of a port service is 200 Gbs, to-be-encoded data that is input in two unit times (that is, 2 seconds) is first stored. Then, the stored to-be-encoded data is input to an encoder.

In such an embodiment, by turning on or turning off the splitter and the combiner, a plurality of operating modes may be flexibly supported by using a set of architecture. In this manner, "decoupling" between a throughput capability and a bit width (a throughput capability of an encoding architecture) of the encoder can be implemented. This facilitates sharing of encoder resources, thereby effectively reducing power consumption. In addition, because the encoder in the encoder resource pool has lower complexity of feedback matrix calculation (that is, includes more 0 elements that are not involved in calculation), a time sequence is more easily converged in a high-speed clock.

Figure 14:
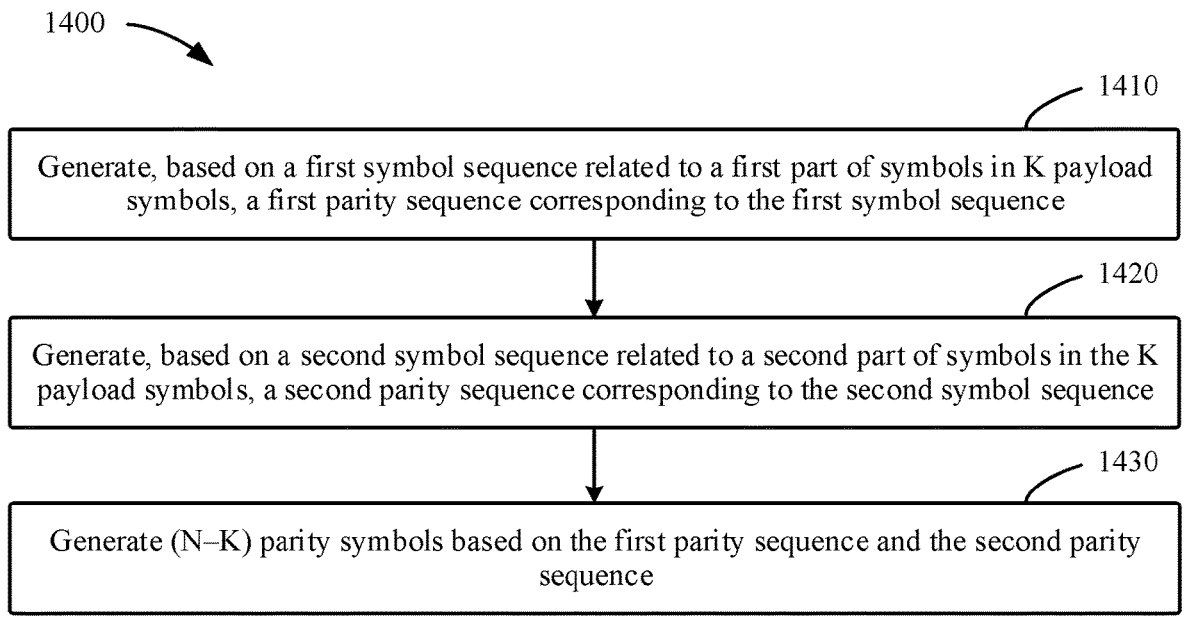
FIG. 14 is a flowchart of a cyclic code encoding method according to an embodiment of the present disclosure.

FIG. 14 is a flowchart of a cyclic code encoding method 1400 according to an embodiment of the present disclosure. The method 1400 may be implemented in the architecture 400 shown in FIG. 4. A first cyclic code includes K payload symbols and (N–K) parity symbols, and each symbol includes m bits, where K, N, and m are integers greater than or equal to 1, and N is greater than K.

In block 1410, a first parity sequence corresponding to a first symbol sequence is generated based on the first symbol sequence related to a first part of symbols in the K payload symbols. In block 1420, a second parity sequence corresponding to a second symbol sequence is generated based on the second symbol sequence related to a second part of symbols in the K payload symbols. The first part of symbols are different from the second part of symbols. For example, an encoder in the encoder resource pool 402 may perform actions of the blocks 1410 and 1420. A quantity of symbols included in each of the first parity sequence and the second parity sequence is (N−K).

In block 1430, (N−K) parity symbols are generated based on the first parity sequence and the second parity sequence. For example, the combiner 403 may perform the actions of the blocks 1410 and 1420. In some embodiments, a square of each symbol in the first parity sequence and a square of each symbol in the second parity sequence may be generated. (N−K) parity symbols are generated based on a square of a symbol generated for the first parity sequence and the second parity sequence and a generator polynomial of the first cyclic code.

The method 1400 may further include an additional action. In some embodiments, it may be determined whether a first data rate of first to-be-encoded data including the K payload symbols exceeds a data rate threshold. If it is determined that the first data rate exceeds the data rate threshold, it is determined, based on the first data rate and the data rate threshold, that the K payload symbols are to be split into L symbol sequences, where L is a positive integer greater than 1. Then, the L symbol sequences may be generated based on the K payload symbols, where the L symbol sequences include the first symbol sequence and the second symbol sequence.

In some embodiments, for an $i^{th}$ symbol sequence in the L symbol sequences, a $j^{th}$ symbol in the $i^{th}$ symbol sequence may be generated based on an $(i+L*j)^{th}$ symbol in the K payload symbols. j is an integer ranging from 0 to (K/L−1), and i is an integer ranging from 0 to (L−1). In some embodiments, m is an integer greater than 1, each symbol in the first symbol sequence is equal to an $L^{th}$ root of a corresponding symbol in the first part of symbols, and each symbol in the second symbol sequence is equal to an $L^{th}$ root of a corresponding symbol in the second part of symbols.

In some embodiments, for example, in a case of one-level splitting, the first symbol sequence may be generated based on a square root of an even-numbered symbol in the K payload symbols. The second symbol sequence may be generated based on a square root of an odd-numbered symbol in the K payload symbols. In a case of one-level combination, a rearranged parity sequence may be generated based on the first parity sequence and the second parity sequence. In the rearranged parity sequence, squares of parity symbols in the first parity sequence and squares of parity symbols in the second parity sequence are arranged in an interleaved manner. (N−K) parity symbols are generated based on the rearranged parity sequence and a generator polynomial of the first cyclic code.

In some embodiments, for example, in a case of two-level splitting, a first primary symbol sequence and a second primary symbol sequence may be respectively generated based on an even-numbered symbol and an odd-numbered symbol in the K payload symbols, for example, primary symbol sequences 1110-1 and 1110-2 shown in FIG. 11. Then, the two primary symbol sequences may be further split. Specifically, a first secondary symbol sequence and a second secondary symbol sequence may be respectively generated based on an even-numbered symbol and an odd-numbered symbol in the first primary symbol sequence, for example, secondary symbol sequences 1120-1 and 1120-2 shown in FIG. 11. A third secondary symbol sequence and a fourth secondary symbol sequence, for example, 1120-3 and 1120-4, may be respectively generated based on an even-numbered symbol and an odd-numbered symbol in the second primary symbol sequence.

In a case of two-level combination, a first primary combined sequence (for example, a primary combined sequence 1230-1) may be generated based on a parity sequence (for example, a parity sequence 1210-1) corresponding to the first secondary symbol sequence, a parity sequence (for example, a parity sequence 1210-2) corresponding to the second secondary symbol sequence, and a generator polynomial of the first cyclic code. A second primary combined sequence (for example, a primary combined sequence 1230-2) may be generated based on a parity sequence (for example, a parity sequence 1210-3) corresponding to the third secondary symbol sequence, a parity sequence (for example, a parity sequence 1210-4) corresponding to the fourth secondary symbol sequence, and a generator polynomial. Then, (N−K) symbols may be generated based on the first primary combined sequence, the second primary combined sequence, and the generator polynomial.

In some embodiments, a second cyclic code includes K' payload symbols and (N'—K') parity symbols, and each symbol includes m bits, where K' and N' are integers greater than or equal to 1, N' is greater than K', and (N'—K') is equal to (N−K). The method 1400 may further include: determining whether a second data rate of second to-be-encoded data including the K' payload symbols exceeds a data rate threshold; and if it is determined that the second data rate does not exceed the data rate threshold, generating the (N'—K') parity symbols based on the K' payload symbols.

In some embodiments, the second data rate is less than the data rate threshold. In such an embodiment, the second to-be-encoded data passed over time may be stored. The (N'—K') parity symbols are generated based on the K' payload symbols in response to a case in which a data amount of the stored second to-be-encoded data matches the data rate threshold.

Figure 15:
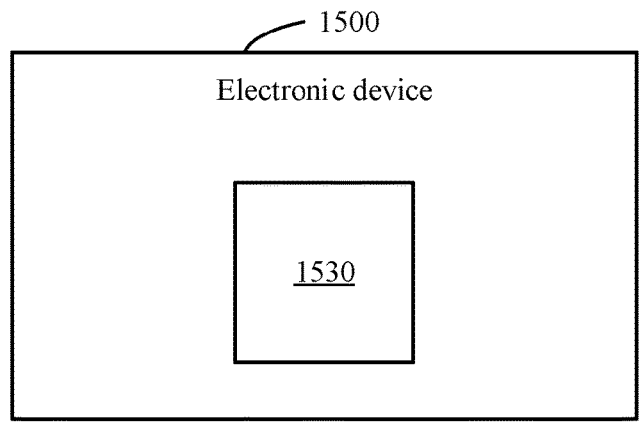
FIG. 15 is a schematic diagram of an electronic device according to some embodiments of the present disclosure.

FIG. 15 is a schematic diagram of an electronic device 1500 according to some embodiments of the present disclosure. The electronic device 1500 is, for example, a computer, a router, a switch, a smartphone, a tablet computer, or another intelligent terminal device. The electronic device 1500 may also be another similar electronic device. The electronic device 1500 includes an integrated circuit component 1530 and another component that is not shown, such as another chip or a sensor. The integrated circuit component 1530 may be formed as at least a part of an integrated circuit system. In some embodiments, the integrated circuit component 30 may include a plurality of chips on a circuit board such as a printed circuit board (PCB) or a flexible printed circuit (FPC). The cyclic code encoding scheme according to the embodiments of the present disclosure may be implemented at one or more chips. For example, one or more elements shown in FIG. 4 to FIG. 13 may be implemented at a chip.

The cyclic code encoding scheme according to the embodiments of the present disclosure may be used in any scenario that has a requirement for cyclic code encoding. For example, the cyclic code encoding scheme may be applied to CRC calculation at a MAC layer of an Ethernet standard architecture and an RS encoder at a PCS layer. A CRC calculating unit of the MAC layer may generate CRC data of a frame by using the cyclic code encoding scheme. The RS encoder at the PCS layer may complete encoding by using the cyclic code encoding scheme, to form an RS code word.

Furthermore, although implementations of the splitter and the combiner are described above with reference to hardware elements (for example, a root operator, a selector, and a square operator), it should be understood that a splitting operation and a combination operation described with reference to such a hardware element may also be implemented by a software module.

What is claimed is:

1. A method comprising:
generating, based on a first symbol sequence related to a first part of K payload symbols of a first cyclic code, a first parity sequence corresponding to the first symbol sequence, wherein K is an integer greater than 1;
generating, based on a second symbol sequence related to a second part of the K payload symbols, a second parity sequence corresponding to the second symbol sequence, wherein the first part is different from the second part; and
generating (N−K) parity symbols based on the first parity sequence and the second parity sequence,
wherein N is an integer greater than K.

2. The method of claim 1, further comprising:
determining whether a first data rate of first to-be-encoded data comprising the K payload symbols exceeds a data rate threshold;
determining, when the first data rate exceeds the data rate threshold, that the K payload symbols are to be split into L symbol sequences, wherein L is an integer greater than 1; and
generating the L symbol sequences based on the K payload symbols, wherein the L symbol sequences comprise the first symbol sequence and the second symbol sequence.

3. The method of claim 2, wherein the generating the L symbol sequences comprises generating, for an $i^{th}$ symbol sequence in the L symbol sequences, $j^{th}$ symbol in the $i^{th}$ symbol sequence based on an $(i+L*j)^{th}$ symbol in the K payload symbols, wherein i is an integer ranging from 0 to (L−1), and wherein j is an integer ranging from 0 to (K/L−1).

4. The method of claim 1, wherein each of the K payload symbols and the (N−K) parity symbols comprises m symbols, wherein m is an integer greater than 1, wherein each first symbol in the first symbol sequence is equal to an $L^{th}$ root of a first corresponding symbol in the first part-of-symbols, and wherein each second symbol in the second symbol sequence is equal to an $L^{th}$ root of a second corresponding symbol in the second part.

5. The method of claim 1, wherein each of the first parity sequence and the second parity sequence comprises (N−K) symbols.

6. The method of claim 1, further comprising:
generating squares of symbols in the first parity sequence and in the second parity sequence; and
further generating the (N−K) parity symbols based on the squares and a generator polynomial of the first cyclic code.

7. The method of claim 1, further comprising:
determining whether a second data rate of second to-be-encoded data comprising K' payload symbols of a second cyclic code exceeds a data rate threshold; and
generating, when the second data rate does not exceed the data rate threshold, (N'−K') parity symbols based on the K' payload symbols.

8. The method of claim 7, wherein when the second data rate is less than the data rate threshold, the method further comprises:
storing the second to-be-encoded data as stored data; and
generating, during the storing and once an amount of the stored data matches the data rate threshold, the (N'−K') parity symbols based on the K' payload symbols.

9. The method of claim 1, further comprising:
generating the first symbol sequence based on a first square root of an even-numbered symbol in the K payload symbols; and
generating the second symbol sequence based on a second square root of an odd-numbered symbol in the K payload symbols.

10. The method of claim 1, further comprising:
generating a rearranged parity sequence based on the first parity sequence and the second parity sequence, wherein the rearranged parity sequence comprises first squares of first parity symbols in the first parity sequence interleaved with second squares of second parity symbols in the second parity sequence; and
further generating the (N−K) parity symbols based on the rearranged parity sequence and a generator polynomial of the first cyclic code.

11. The method of claim 1, further comprising:
generating a first primary symbol sequence based on a first even-numbered symbol in the K payload symbols;
generating a second primary symbol sequence based on a first odd-numbered symbol in the K payload symbols;
generating a first secondary symbol sequence based on a second even-numbered symbol in the first primary symbol sequence;
generating a second secondary symbol sequence based on a second odd-numbered symbol in the first primary symbol sequence;
generating a third secondary symbol sequence based on a third even-numbered symbol in the second primary symbol sequence; and
generating a fourth secondary symbol sequence based on a third odd-numbered symbol in the second primary symbol sequence,
wherein the first symbol sequence and the second symbol sequence are two of the first secondary symbol sequence, the second secondary symbol sequence, the third secondary symbol sequence, or the fourth secondary symbol sequence.

12. The method of claim 11, further comprising:
generating a first primary combined sequence based on a third parity sequence corresponding to the first secondary symbol sequence, a fourth parity sequence corresponding to the second secondary symbol sequence, and a generator polynomial of the first cyclic code;
generating a second primary combined sequence based on a fifth parity sequence corresponding to the third secondary symbol sequence, a sixth parity sequence corresponding to the fourth secondary symbol sequence, and the generator polynomial; and
further generating the (N−K) symbols based on the first primary combined sequence, the second primary combined sequence, and the generator polynomial.

13. A chip comprising:
a first encoder configured to generate, based on a first symbol sequence related to a first part of K payload symbols of a first cyclic code, a first parity sequence corresponding to the first symbol sequence, wherein K is an integer greater than 1;
a second encoder configured to generate, based on a second symbol sequence related to a second part of the K payload symbols, a second parity sequence corresponding to the second symbol sequence, wherein the first part is different from the second part; and
a combiner configured to generate the (N−K) parity symbols based on the first parity sequence and the second parity sequence,
wherein N is an integer greater than K.

14. The chip of claim 13, further comprising:
a controller configured to:
   determine whether a first data rate of first to-be-encoded data comprising the K payload symbols exceeds a data rate threshold;
   determine, when the first data rate exceeds the data rate threshold, that the K payload symbols are to be split into L symbol sequences, wherein L is an integer greater than 1; and
   generate a first control instruction instructing that the K payload symbols are to be split into the L symbol sequences; and
a splitter configured to generate the L symbol sequences in response to the first control instruction and based on the K payload symbols, wherein the L symbol sequences comprise the first symbol sequence and the second symbol sequence.

15. The chip of claim 14, wherein the splitter is further configured to generate the L symbol sequences by generating, for an $i^{th}$ symbol sequence in the L symbol sequences, wherein i is an integer ranging from 0 to (L−1), a $j^{th}$ symbol in the $i^{th}$ symbol sequence based on an $(i+L*j)^{th}$ symbol in the K payload symbols, wherein i is an integer ranging from 0 to (L−1), and wherein j is an integer ranging from 0 to (K/L−1).

16. The chip of claim 14, wherein the splitter comprises:
a $\log_2$ L-level sub-splitter, and each sub-splitter is configured to: comprising sub-splitters, wherein each of the sub-splitters is configured to generate two symbol sequences based on a received symbol sequence, wherein the two symbol sequences are respectively related to an even-numbered symbol in the received symbol sequence and an odd-numbered symbol in the received symbol sequence;
a level-1 sub-splitter configured to receive the K payload symbols; and
a level-$\log_2$ L sub-splitter configured to generate the first symbol sequence and the second symbol sequence.

17. The chip of claim 13, wherein the combiner comprises:
sub-combiners configured to:
   generate a parity sequence based on two received parity sequences and a generator polynomial of the first cyclic code; and
   form a $\log_2$ L-level sub-combiner;
a level-1 sub-combiner configured to receive the first parity sequence and the second parity sequence; and
a level-1 sub-combiner configured to generate the (N−K) parity symbols.

18. The chip of claim 13, wherein each of the K payload symbols and the (N−K) parity symbols comprises m symbols, wherein m is an integer greater than 1, wherein each first symbol in the first symbol sequence is equal to an $L^{th}$ root of a first corresponding symbol in the first part, and wherein each second symbol in the second symbol sequence is equal to an $L^{th}$ root of a second corresponding symbol in the second part-of-symbols.

19. The chip of claim 13, wherein each of the first parity sequence and the second parity sequence comprises (N−K) symbols.

20. The chip of claim 13, wherein the combiner is further configured to:
generate squares of symbols in the first parity sequence and in the second parity sequence; and
further generate the (N−K) parity symbols based on the squares and a generator polynomial of the first cyclic code.

21. The chip of claim 13, further comprising:
a controller configured to:
   determine whether a second data rate of second to-be-encoded data comprising K' payload symbols of a second cyclic code exceeds a data rate threshold; and
   generating, when the second data rate does not exceed the data rate threshold, a second control instruction instructing not to split the K' payload symbols; and
a third encoder configured to generate (N'−K') parity symbols in response to the second control instruction and based on the K' payload symbols.

22. The chip of claim 21, wherein when the second data rate is less than the data rate threshold, the third encoder is further configured to:
store the second to-be-encoded data as stored data; and
generate, during the storing and once an amount of the stored data matches the data rate threshold, the (N'−K') parity symbols based on the K' payload symbols.

23. The chip of claim 13, further comprising a splitter configured to:
generate the first symbol sequence based on a first square root of an even-numbered symbol in the K payload symbols; and
generate the second symbol sequence based on a second square root of an odd-numbered symbol in the K payload symbols.

24. The chip of claim 13, wherein the combiner is further configured to:
generate a rearranged parity sequence based on the first parity sequence and the second parity sequence, wherein the rearranged parity sequence comprises first squares of first parity symbols in the first parity sequence interleaved with second squares of second parity symbols in the second parity sequence; and
further generate the (N−K) parity symbols based on the rearranged parity sequence and a generator polynomial of the first cyclic code.

25. The chip of claim 13, further comprising:
a first sub-splitter configured to:
   generate a first primary symbol sequence based on a first even-numbered symbol in the K payload symbols; and
   generate a second primary symbol sequence based on a first odd-numbered symbol in the K payload symbols;
a second sub-splitter configured to:
   generate a first secondary symbol sequence based on a second even-numbered symbol in the first primary symbol sequence; and
   generate a second secondary symbol sequence based on a second odd-numbered symbol in the first primary symbol sequence; and
a third sub-splitter configured to:
   generate a third secondary symbol sequence based on a third even-numbered symbol in the second primary symbol sequence; and
   generate a fourth secondary symbol sequence based on a third odd-numbered symbol in the second primary symbol sequence,
   wherein the first symbol sequence and the second symbol sequence are two of the first secondary symbol sequence, the second secondary symbol sequence, the third secondary symbol sequence, or the fourth secondary symbol sequence.

26. The chip of claim 25, wherein the combiner comprises:
a first sub-combiners configured to generate a first primary combined sequence based on a third parity sequence corresponding to the first secondary symbol sequence, a fourth parity sequence corresponding to the second secondary symbol sequence, and a generator polynomial of the first cyclic code;

a second sub-combiners configured to generate a second primary combined sequence based on a fifth parity sequence corresponding to the third secondary symbol sequence, a sixth parity sequence corresponding to the fourth secondary symbol sequence, and the generator polynomial; and a third sub-combiner configured to further generate the (N−K) symbols based on the first primary combined sequence, the second primary combined sequence, and the generator polynomial.

27. A circuit component comprising:

a circuit board; and a chip mounted on the circuit board and comprising:
- a first encoder configured to generate, based on a first symbol sequence related to a first part of K payload symbols of a first cyclic code, a first parity sequence corresponding to the first symbol sequence, wherein K is an integer greater than 1;
- a second encoder configured to generate, based on a second symbol sequence related to a second part of the K payload symbols, a second parity sequence corresponding to the second symbol sequence, wherein the first part is different from the second part; and
- a combiner configured to generate the (N−K) parity symbols based on the first parity sequence and the second parity sequence, wherein N is an integer greater than K.

* * * * *

UNITED STATES PATENT AND TRADEMARK OFFICE
CERTIFICATE OF CORRECTION

PATENT NO. : 12,339,738 B2
APPLICATION NO. : 18/489276
DATED : June 24, 2025
INVENTOR(S) : Liang Li et al.

Page 1 of 1

It is certified that error appears in the above-identified patent and that said Letters Patent is hereby corrected as shown below:

In the Claims

Claim 4, Column 25, Lines 41-42: "first part-of-symbols, and wherein" should read "first part, and wherein"

Claim 18, Column 27, Line 57: "second part-of-symbols." should read "second part."

Signed and Sealed this
Fifth Day of August, 2025

Coke Morgan Stewart
*Acting Director of the United States Patent and Trademark Office*